(12) United States Patent
Kim et al.

(10) Patent No.: US 12,256,585 B2
(45) Date of Patent: Mar. 18, 2025

(54) THIN FILM TRANSISTOR AND METHOD OF MANUFACTURING THE SAME AND THIN FILM TRANSISTOR PANEL AND ELECTRONIC DEVICE

(71) Applicant: Samsung Electronics Co., Ltd., Suwon-si (KR)

(72) Inventors: Joo Young Kim, Hwaseong-si (KR); Byong Gwon Song, Seoul (KR); Jeong Il Park, Seongnam-si (KR); Jiyoung Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 439 days.

(21) Appl. No.: 17/675,387

(22) Filed: Feb. 18, 2022

(65) Prior Publication Data

US 2022/0190266 A1 Jun. 16, 2022

Related U.S. Application Data

(62) Division of application No. 16/203,831, filed on Nov. 29, 2018, now Pat. No. 11,296,289.

(30) Foreign Application Priority Data

Jun. 1, 2018 (KR) .................. 10-2018-0063719

(51) Int. Cl.
*H10K 10/46* (2023.01)
*H01L 29/423* (2006.01)
(Continued)

(52) U.S. Cl.
CPC ..... *H10K 10/468* (2023.02); *H01L 29/42384* (2013.01); *H10K 10/466* (2023.02);
(Continued)

(58) Field of Classification Search
CPC .. H19K 10/468; H10K 10/484; H10K 10/488; H10K 10/466; H01L 29/42384; H01L 29/786; H01L 27/1214
See application file for complete search history.

(56) References Cited

U.S. PATENT DOCUMENTS 6,461,968 B1  10/2002  Toyota et al.
6,765,265 B2   7/2004  Yudasaka et al.
(Continued)

FOREIGN PATENT DOCUMENTS

EP   3588596 A1   1/2020
GB   2450381 A   12/2008
(Continued)

OTHER PUBLICATIONS

B. Kang et al. "Enhancing 2D growth of organic semiconductor thin films with macroporous structures via a small-molecule heterointerface" Nat. Comm., (2014) 5, 4752.
(Continued)

*Primary Examiner* — Mary A Wilczewski
(74) *Attorney, Agent, or Firm* — HARNESS, DICKEY & PIERCE, P.L.C.

(57) ABSTRACT

A thin film transistor includes a gate electrode, a semiconductor layer overlapped with the gate electrode, a gate insulating layer between the gate electrode and the semiconductor layer, and a source electrode and a drain electrode electrically connected to the semiconductor layer. The semiconductor layer includes a plurality of holes. The gate insulating layer may include a plurality of recess portions at a surface of the gate insulating layer facing the semiconductor layer. A method of manufacturing the thin film transistor is provided. A thin film transistor array panel and an electronic device may include the thin film transistor.

16 Claims, 26 Drawing Sheets

(51) Int. Cl.
  *H10K 10/84* (2023.01)
  *H10K 19/10* (2023.01)
  *H10K 71/20* (2023.01)
  *H10K 85/60* (2023.01)

(52) U.S. Cl.
  CPC ......... *H10K 10/484* (2023.02); *H10K 10/488* (2023.02); *H10K 10/84* (2023.02); *H10K 19/10* (2023.02); *H10K 71/233* (2023.02); *H10K 85/6576* (2023.02)

(56) References Cited

U.S. PATENT DOCUMENTS

| | | |
|---|---|---|
| 7,170,146 B2 | 1/2007 | Chang et al. |
| 7,173,278 B2 | 2/2007 | Tsujimura et al. |
| 7,417,246 B2 | 8/2008 | Shin et al. |
| 7,646,044 B2 * | 1/2010 | Huh .................. H01L 29/78696 349/149 |
| 7,709,850 B2 | 5/2010 | Wang |
| 7,772,622 B2 | 8/2010 | Fujimori et al. |
| 7,867,813 B2 | 1/2011 | Halls et al. |
| 9,075,273 B2 | 7/2015 | Kim et al. |
| 10,014,483 B2 | 7/2018 | Liu |
| 10,043,916 B2 | 8/2018 | Zhao et al. |
| 10,566,461 B2 * | 2/2020 | An ....................... H01L 27/124 |
| 11,296,289 B2 * | 4/2022 | Kim ..................... H10K 10/484 |
| 2002/0145143 A1 | 10/2002 | Kawasaki et al. |
| 2004/0245523 A1 | 12/2004 | Jen et al. |
| 2007/0153198 A1 | 7/2007 | Cho et al. |
| 2007/0275518 A1 | 11/2007 | Wang |
| 2009/0101893 A1 * | 4/2009 | Halls .................... H10K 10/468 257/40 |
| 2010/0006851 A1 | 1/2010 | Park |
| 2010/0320453 A1 | 12/2010 | Tanaka et al. |
| 2011/0147756 A1 | 6/2011 | Moriguchi et al. |
| 2011/0221991 A1 * | 9/2011 | Ro ....................... H01L 27/1214 257/E29.101 |
| 2013/0062598 A1 | 3/2013 | Usta et al. |
| 2014/0034944 A1 | 2/2014 | Zan et al. |
| 2014/0054583 A1 | 2/2014 | Uemura et al. |
| 2014/0124755 A1 * | 5/2014 | Lee .................. H01L 29/78678 257/40 |
| 2015/0048359 A1 | 2/2015 | Fukase et al. |
| 2015/0102338 A1 | 4/2015 | Kong et al. |
| 2016/0351724 A1 | 12/2016 | Zhao et al. |
| 2017/0200910 A1 | 7/2017 | Liu |
| 2018/0052136 A1 | 2/2018 | Diao et al. |
| 2019/0067422 A1 | 2/2019 | Cho |
| 2019/0372037 A1 | 12/2019 | Kim et al. |

FOREIGN PATENT DOCUMENTS

| | | | |
|---|---|---|---|
| JP | H02206173 A | 8/1990 | |
| JP | 4961819 B2 | 6/2012 | |
| JP | 2008-41914 * | 2/2021 | .......... H01L 29/786 |
| KR | 2007/0114622 A | 12/2007 | |
| KR | 2008/0047152 A | 5/2008 | |
| KR | 101001471 B1 | 12/2010 | |
| WO | WO-2004/088765 A1 | 10/2004 | |
| WO | WO 2004/107473 * | 12/2004 | .......... H01L 51/40 |
| WO | WO 2019/127725 * | 7/2019 | .......... H01L 29/786 |
| WO | WO-2020/036327 A1 | 2/2020 | |
| WO | WO-2020/142881 A1 | 7/2020 | |

OTHER PUBLICATIONS

Extended European Search Report dated Nov. 28, 2019, issued in corresponding European Patent Application No. 19151093.2.

K. Fobelets et al., 'A novel 3D embedded gate field effect transistor—Screen-grid FET—Device concept and modelling' *Solid-State Electronics*, vol. 51, 2007, pp. 749-756.

Notice of Allowance dated Nov. 26, 2021, issued in corresponding U.S. Appl. No. 16/203,831.

* cited by examiner

I

II

I

II

THIN FILM TRANSISTOR AND METHOD OF MANUFACTURING THE SAME AND THIN FILM TRANSISTOR PANEL AND ELECTRONIC DEVICE

CROSS-REFERENCE TO RELATED APPLICATION

This application is a divisional of U.S. application Ser. No. 16/203,831, filed Nov. 29, 2018, which claims priority to and the benefit of Korean Patent Application No. 10-2018-0063719 filed in the Korean Intellectual Property Office on Jun. 1, 2018, the entire contents of each of which are incorporated herein by reference.

BACKGROUND

1. Field

A thin film transistor, a method of manufacturing the same, and a thin film transistor array panel and an electronic device including the same are disclosed.

2. Description of Related Art

A flat panel display, such as a liquid crystal display (LCD), an organic light emitting diode (OLED) display, an electrophoretic display, and the like, includes a pair of electric field-generating electrodes and an electrical active layer interposed therebetween. The liquid crystal display (LCD) includes a liquid crystal layer as an electric active layer, and the organic light emitting diode (OLED) display includes an organic emission layer as an electrical active layer.

One of the pairs of the electric field-generating electrodes is commonly connected to a switching device and receives an electrical signal, and the electrical active layer transforms the electrical signal into an optical signal and thus displays an image.

The flat panel display includes a three-terminal element of a thin film transistor (TFT) as a switch, and also includes a gate line and a data line. The gate line may be used for transferring a scan signal and for controlling the thin film transistor. The data line may be used for transferring a data signal to be applied to a pixel electrode.

SUMMARY

An embodiment provides a thin film transistor capable of realizing improved performance.

Another embodiment provides a method of manufacturing the thin film transistor.

Yet another embodiment provides a thin film transistor array display panel including the thin film transistor.

Still another embodiment provides an electronic device including the thin film transistor or the thin film transistor array display panel.

According to an embodiment, a thin film transistor includes a gate electrode, a semiconductor layer, a gate insulating layer, a source electrode, and a drain electrode. The semiconductor layer may be overlapped with the gate electrode and may include a plurality of holes. The gate insulating layer may be between the gate electrode and the semiconductor layer and may have a plurality of recess portions at a surface of the gate insulating layer facing the semiconductor layer. The source electrode and the drain electrode may be electrically connected to the semiconductor layer.

In some example embodiments, the plurality of holes of the semiconductor layer may correspond to the plurality of recess portions of the gate insulating layer.

In some example embodiments, the semiconductor layer may be on the gate insulating layer, and the plurality of recess portions of the gate insulating layer and the plurality of holes of the semiconductor layer may be overlapped with each other.

In some example embodiments, the plurality of recess portions may be randomly arranged at the surface of the gate insulating layer facing the semiconductor layer.

In some example embodiments, the plurality of holes of the semiconductor layer may be randomly arranged.

In some example embodiments, the plurality of recess portions of the gate insulating layer may repetitively be arranged according to a column or a row at the surface of the gate insulating layer facing the semiconductor layer.

In some example embodiments, the plurality of holes of the semiconductor layer may repetitively be arranged according to a column or a row.

In some example embodiments, the depth of the plurality of recess portions may be about 50% or less of a thickness of the gate insulating layer.

In some example embodiments, the depth of the recess portions may range from about 50 nm to about 1 μm.

In some example embodiments, the width of the recess portions may range from about 50 nm to about 1 μm.

In some example embodiments, an interval between the neighboring recess portions, among the plurality of recess portions, may range from about 100 nm to about 10 μm.

In some example embodiments, the plurality of recess portions may have substantially the same width according to a depth.

In some example embodiments, the plurality of recess portions may have a different width according to a depth.

In some example embodiments, a width of the plurality of recess portions may become wider as a depth from the surface of the gate insulating layer facing the semiconductor layer increases.

In some example embodiments, the thin film transistor may further include a surface-modification layer between the gate insulating layer and the semiconductor layer.

In some example embodiments, the semiconductor layer may be a continuous thin film.

In some example embodiments, the semiconductor layer may include an organic semiconductor.

In some example embodiments, the organic semiconductor may include at least one of a fused polycyclic aromatic compound or a fused polycyclic heteroaromatic compound.

In some example embodiments, a thin film transistor array panel may include a substrate, a gate line and a date line on the substrate, and the thin film transistor connected to the gate line and the date line and disposed in one of a plurality of pixels. The gate line and the date line may cross each other to define a plurality of pixels.

According to another embodiment, a thin film transistor includes an electrode, an insulation layer, and a semiconductor layer. The insulation layer may include surface portion and a plurality of recess portions. The surface portions may have a first thickness. The plurality of recess portions may have a second thickness that is smaller than the first thickness. The semiconductor layer may be selectively on the surface portion of the insulation layer.

In some example embodiments, the semiconductor layer may be a continuous thin film including a plurality of holes and each of the plurality of holes may correspond to corresponding ones of the recess portions of the insulation layer.

In some example embodiments, the width of each of the plurality of recess portions may range from about 50 nm to about 1 µm.

In some example embodiments, the interval between neighboring recess portions, among the plurality of recess portions, may range from about 100 nm to about 10 µm.

In some example embodiments, the gate insulating layer may be on a whole surface of the substrate, the gate insulating layer may include a first region overlapped with the semiconductor layer and a second region that is not part of the first region, and the plurality of recess portions may be in the first region.

According to another embodiment, a method of manufacturing a thin film transistor includes forming a gate electrode, forming a gate insulating layer, forming a semiconductor layer having holes connected to a surface of the gate insulating layer such that the gate insulating layer extends between the semiconductor layer and the gate electrode, and forming a source electrode and a drain electrode connected to the semiconductor layer. The gate insulating layer may have plurality of recess portions at the surface of the gate insulating layer.

In some example embodiments, the forming the gate insulating layer may include forming the plurality of recess portions at the surface of the gate insulating layer using at least one of a photolithography process or an electron beam lithography.

In some example embodiments, the holes of the semiconductor layer may correspond to the plurality of recess portions of the gate insulating layer.

In some example embodiments, the forming the semiconductor layer may include depositing or coating a semiconductor material on the surface of the gate insulating layer having the recess portions and the semiconductor material may be selectively deposited or coated on the surface of the gate insulating layer except for the recess portions.

In some example embodiments, a part of the semiconductor material may flow into the recess portions and the part of semiconductor material that flows into the plurality of recess portions may not be connected to the semiconductor material on the surface of the gate insulating layer.

In some example embodiments, the manufacturing method may further include modifying the gate insulating layer before forming the semiconductor layer.

According to another embodiment, an electronic device includes the thin film transistor.

According to some example embodiments, a thin film transistor includes a substrate, a plurality of electrodes spaced apart from each other on the substrate, a semiconductor layer on the substrate, and a gate insulating layer. The plurality of electrodes may include a source electrode, a drain electrode, and a gate electrode. The gate electrode may be between the source electrode and the drain electrode in a plan view. The semiconductor layer may face the gate electrode. The semiconductor layer may include a plurality of holes spaced apart from each other. The semiconductor layer may be electrically connected to the source electrode and the drain electrode. The gate insulating layer may extend between the semiconductor layer and the gate electrode. The gate insulating layer may include a first surface facing the semiconductor layer. The first surface of the gate insulating layer may include a plurality of recess portions under the plurality of holes of the semiconductor layer.

In some example embodiments, the semiconductor layer may be a continuous layer and the semiconductor layer may include an organic semiconductor.

In some example embodiments, the organic semiconductor may include at least one of a fused polycyclic aromatic compound or a fused polycyclic heteroaromatic compound.

In some example embodiments, a width of each of the plurality of recess portions ranges from about 50 nm to about 1 µm. An interval between two neighboring recess portions, among the plurality of recess portions, may range from about 100 nm to about 10 µm.

In some example embodiments, an electronic device may include the thin film transistor, a gate line connected to the gate electrode, a data line connected to the source electrode.

According to inventive concepts, a thin film transistor having a high performance may be realized.

DETAILED DESCRIPTION

Figure 1:
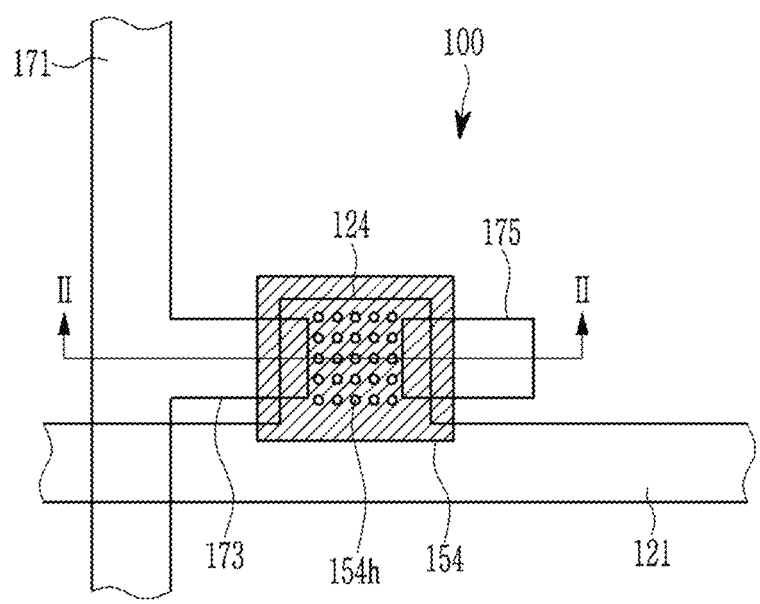
FIG. 1 is a schematic top plan view showing a thin film transistor according to an embodiment.

Example embodiments will hereinafter be described in detail, and may be easily performed by those who have common knowledge in the related art. However, this disclosure may be embodied in many different forms and is not to be construed as limited to the embodiments set forth herein.

When a definition is not otherwise provided, "substituted" refers to replacement of hydrogen of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C30 heteroaryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when specific definition is not otherwise provided, "hetero" refers to one including 1 to 3 heteroatoms selected from N, O, S, Se, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a thin film transistor according to an embodiment is described.

Figure 2:
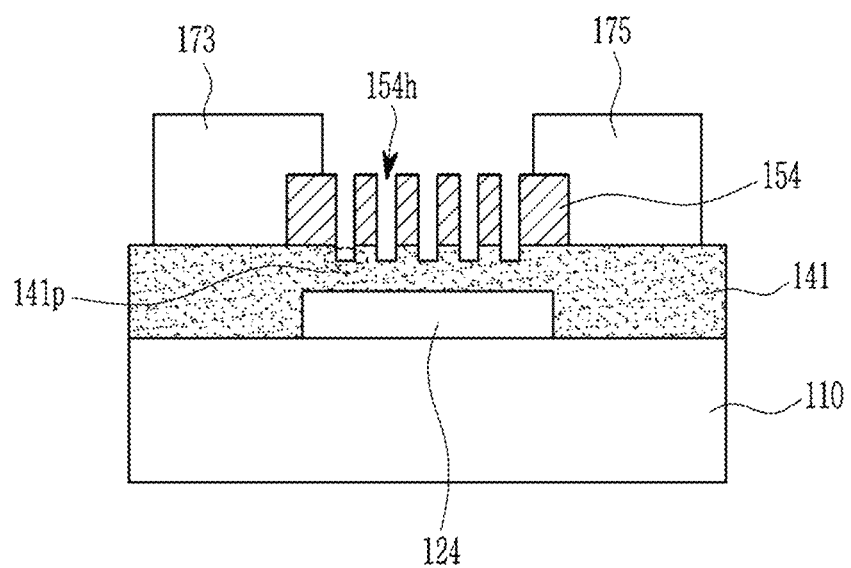
FIG. 2 is a cross-sectional view taken along the II-II line of FIG. 1.

FIG. 1 is a schematic top plan view of a thin film transistor according to an embodiment and FIG. 2 is a cross-sectional view taken along the II-II line of FIG. 1.

Figure 3:
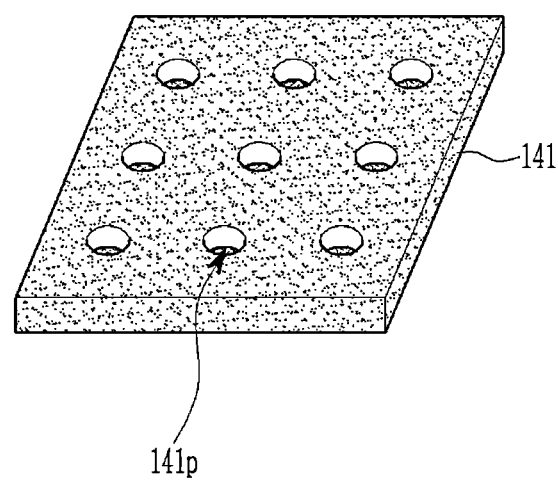
FIG. 3 is a schematic view showing a surface of a gate insulating layer according to an embodiment.
Figure 4:
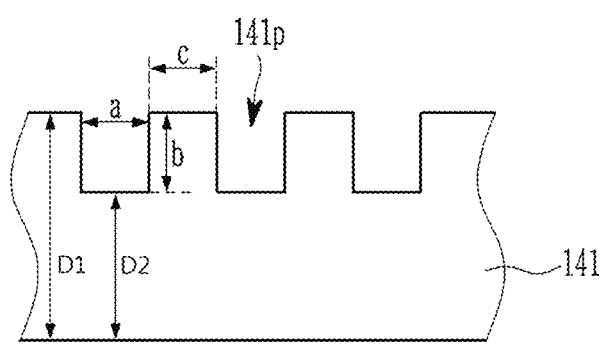
FIG. 4 is a schematic view showing a cross-section of a gate insulating layer according to an embodiment.
Figure 5:
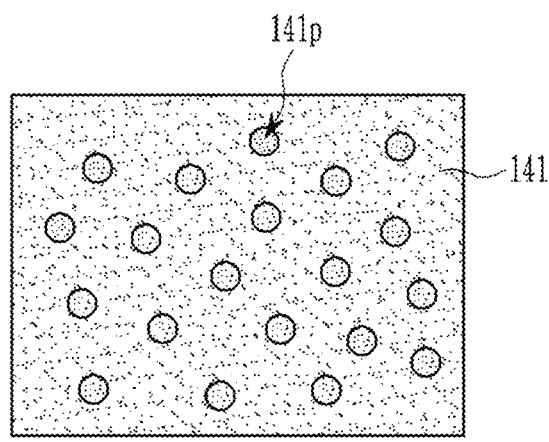
FIGS. 5 and 6 are schematic views showing various arrangements of recess portions of gate insulating layers according to embodiments.
Figure 6:
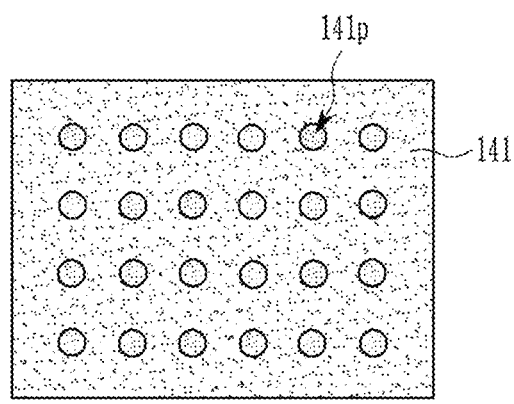

FIG. 3 is a schematic view showing a surface of a gate insulating layer 141 according to an embodiment, FIG. 4 is a schematic view showing a cross-section of a gate insulating layer according to an embodiment, and FIGS. 5 and 6 are schematic views showing various arrangements of recess portions 141p of gate insulating layers 141 according to embodiments.

Figure 7:
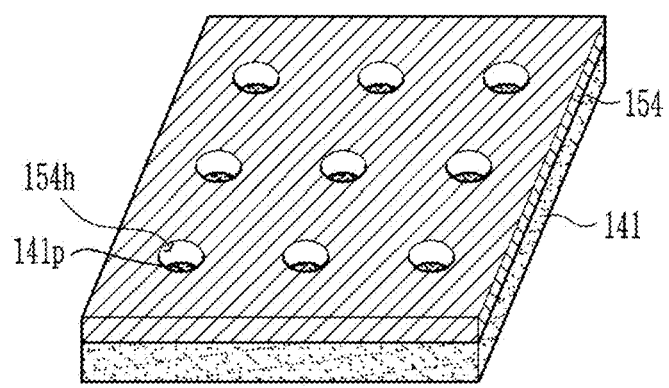
FIG. 7 is a schematic view showing a surface of the semiconductor layer according to an embodiment.

FIG. 7 is a schematic view showing a surface of a semiconductor layer 154 according to an embodiment.

Figure 8:
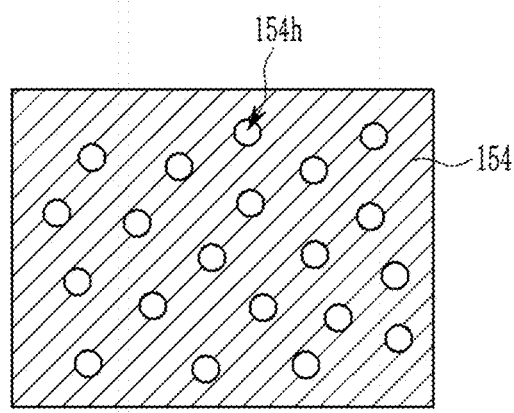
FIGS. 8 and 9 are schematic views showing arrangements of holes of semiconductor layers according to each embodiment.
Figure 9:
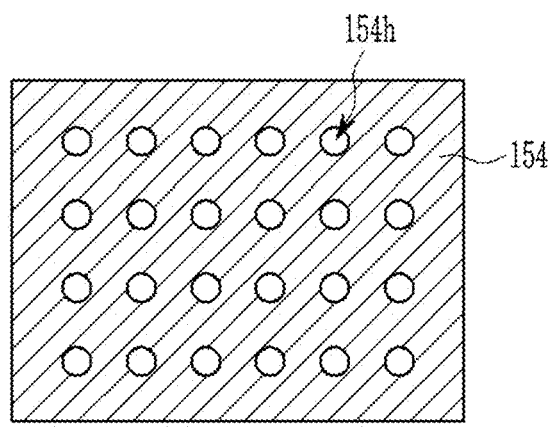

FIGS. 8 and 9 are schematic views showing arrangements of holes 154h of semiconductor layers 154 according to each embodiment.

A thin film transistor 100 according to an embodiment includes a gate electrode 124, a gate insulating layer 141, a semiconductor layer 154, a source electrode 173, and a drain electrode 175.

The substrate 110 may support the thin film transistor 100 and may be for example an insulation substrate such as transparent glass or a polymer, or a silicon wafer. The polymer may include for example polyethylene terephthalate, polyethylene naphthalate, polycarbonate, polyacrylate, polyimide, or a combination thereof, but is not limited thereto.

The gate electrode 124 is connected to a gate line 121 transferring a gate signal. The gate electrode 124 may be for example made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto. However, when the substrate 110 is a silicon wafer, the gate electrode 124 may be a doping region of the silicon wafer. The gate electrode 124 may include one layer or two or more layers.

The gate insulating layer 141 is formed on the gate electrode 124. The gate insulating layer 141 is formed on the whole surface of the substrate 110 and may include a first region in the thin film transistor 100 and a second region in the region except the thin film transistor 100. For example, the first region may be a region overlapped with the semiconductor layer 154 and the second region may be a region except the first region. For example, the first region may be a region in which a channel of the thin film transistor 100 is formed and the second region may be a region except the first region.

A plurality of recess portions 141p are formed at the surface of the gate insulating layer 141. The recess portions 141p may have a lower surface than a main surface of the gate insulating layer 141, and may be, for example, a pattern having a desired (and/or alternatively predetermined) width and depth. For example, the gate insulating layer 141 may have a surface portion having a first thickness D1 corresponding to a thickness of the gate insulating layer 141 and the recess portions 141p having a thinner second thickness D2 than the first thickness D1.

The plurality of recess portions 141p are randomly or regularly arranged with a desired (and/or alternatively predetermined) interval at the surface of the gate insulating layer 141. The plurality of recess portions 141p may be disposed in a region where the thin film transistor 100 is disposed, that is, in a first region of the gate insulating layer 141.

Referring to FIGS. 3 and 4, the plurality of recess portions 141p having a desired (and/or alternatively predetermined) width (a) and depth (b) may be formed with a desired (and/or alternatively predetermined) interval (c) at the surface of the gate insulating layer 141.

For example, the width (a) of the recess portions 141p may be in a sub-micrometer range, for example, in a range of about 5 nm to about 1 μm, and/or about 10 nm to about 1 μm, about 20 nm to about 1 μm, about 30 nm to about 1 μm, about 40 nm to about 1 μm, about 50 nm to about 1 μm, about 50 nm to about 800 nm, about 50 nm to about 700 nm, about 50 nm to about 600 nm, or about 50 nm to about 500 nm. The recess portions 141p may have substantially the same width (a) depending on a depth. The width (a) of the plurality of recess portions 141p may be the same or different.

For example, the depth (b) of the recess portions 141p may be less than or equal to about 50% of the first thickness D1, a thickness of the gate insulating layer 141. Within the range, the depth (b) of the recess portions 141p may be less than or equal to about 40%, less than or equal to about 30%, less than or equal to about 25%, or less than or equal to about 20% of the thickness D1 of the gate insulating layer 141. For example, the depth (b) of the recess portions 141p may be within a sub-micrometer range, for example, in a range of about 20 nm to about 1 μm, about 30 nm to about 1 μm, about 40 nm to about 1 μm, about 50 nm to about 1 μm, about 50 nm to about 800 nm, about 50 nm to about 700 nm, about 50 nm to about 600 nm, or about 50 nm to about 500 nm. The depth (b) of the plurality of recess portions 141p may be the same or different.

For example, the interval (c) among the neighboring recess portions 141p may be for example in a range of about 50 nm to about 10 μm, about 70 nm to about 10 μm, about 80 nm to about 10 μm, about 90 nm to about 10 μm, about 100 nm to about 10 μm, about 100 nm to about 8 μm, for example about 100 nm to about 6 μm, and about 100 nm to about 5 μm. The interval (c) among the recess portions 141p may be the same or different.

For example, referring to FIG. 5, the plurality of recess portions 141p may be randomly arranged at the surface of the gate insulating layer 141.

For example, referring to FIG. 6, the plurality of recess portions 141p may be repetitively arranged according to a row and/or a column at the surface of the gate insulating layer 141. For example, the plurality of recess portions 141p may be arranged as a lattice structure.

The gate insulating layer 141 may be made of an organic material, an inorganic material, or an organic/inorganic material. Examples of the organic material may include a compound such as one of a polyvinyl alcohol-based compound, a polyvinyl phenol-based compound, a polyimide-based compound, a polyacryl-based compound, a polystyrene-based compound, a benzocyclobutane (BCB), or a combination thereof. Examples of the inorganic material may include a silicon nitride ($SiN_x$), a silicon oxide ($SiO_2$), aluminum oxide ($Al_2O_3$), hafnium oxide ($HfO_2$), or a combination thereof, and examples of the organic/inorganic material may be polysiloxane but are not limited thereto. The gate insulating layer 141 may include for example one layer or two or more layers.

The gate insulating layer 141 may have a thickness of about 100 nm to about 3 μm, but is not limited thereto.

The semiconductor layer 154 is formed on the gate insulating layer 141. The semiconductor layer 154 overlaps with the gate electrode and the gate insulating layer 141 interposed therebetween. The semiconductor layer 154 may have for example an island shape, but is not limited thereto.

The semiconductor layer 154 may be a continuous thin film having a plurality of holes 154h. The holes 154h may be fine holes penetrated in a thickness direction from one surface of the semiconductor layer 154 to the other surface of the semiconductor layer 154. The continuous thin film may be a thin film connected without a breakage from a first side of the semiconductor layer 154 to a second surface of the semiconductor layer 154 facing the first side of the semiconductor layer 154.

The semiconductor layer 154 may have substantially the same morphology as a morphology of the surface of the gate insulating layer 141. Accordingly, the plurality of holes 154h of the semiconductor layer 154 may be disposed corresponding to the plurality of recess portions 141p of the gate insulating layer 141. For example, the recess portions 141p of the gate insulating layer 141 and the holes 154h of the semiconductor layer 154 may be overlapped along a vertical direction of the substrate 110.

For example, referring to FIG. 7, the semiconductor layer 154 has the plurality of holes 154h exposing the gate insulating layer 141, and the recess portions 141p of the gate insulating layer 141 may be exposed through the plurality of holes 154h.

For example, referring to FIG. 8, the holes 154h of the semiconductor layer 154 may be randomly arranged. The plurality of recess portions 141p of the gate insulating layer 141 may be randomly arranged at the surface of the gate insulating layer 141, as shown in FIG. 5

For example, referring to FIG. 9, the holes 154h of the semiconductor layer 154 may be repetitively arranged along a row and/or a column. For example, the holes 154h of the semiconductor layer 154 may be arranged as a lattice structure. The plurality of recess portions 141p of the gate insulating layer 141 may be arranged as a lattice structure, as shown in FIG. 6.

Figure 10:
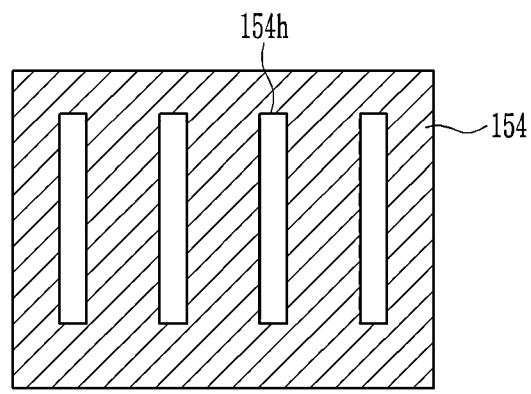
FIGS. 10 and 11 are schematic views showing arrangements of holes of semiconductor layers according to each embodiment.

For example, referring to FIG. 10, the holes 154h of the semiconductor layer 154 may be rectangular. The plurality of recess portions 141p of the gate insulating layer 141 may be rectangular.

Figure 11:
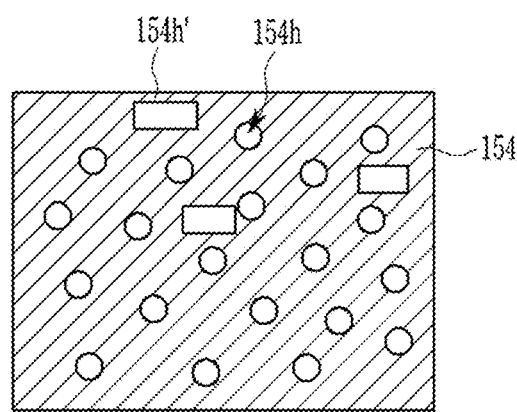

For example, referring to FIG. 11, the semiconductor layer 154 may have first holes 154h and second holes 154h' of different sizes and/or shapes. The plurality of recess portions 141p of the gate insulating layer 141 may have first recess portions and second recess portions of different sizes and/or shapes.

The semiconductor layer 154 may be formed as a continuous thin film having the plurality of holes 154h due to the recess portions 141p at the surface of the gate insulating layer 141. Accordingly, the semiconductor layer 154 may include a semiconductor having a larger grain size and a less grain boundary than a semiconductor of a semiconductor layer having no hole but a flat surface. Therefore, carrier mobility of the thin film transistor 100 may be improved.

The semiconductor layer 154 may include a semiconductor material, for example, an inorganic semiconductor material or an organic semiconductor material. For example, the semiconductor layer 154 may include an organic semiconductor material.

The organic semiconductor material may be for example a low molecular organic semiconductor material wherein the low molecular organic semiconductor material may be an organic semiconductor material having an average molecular weight of less than or equal to about 3000. For example, the organic semiconductor material may be an aromatic compound and/or a heteroaromatic compound. For example, the organic semiconductor material may be a fused polycyclic aromatic compound and/or a fused polycyclic heteroaromatic compound, for example a fused polycyclic aromatic compound such as pentacene and/or a fused polycyclic heteroaromatic compound including at least one O, S, Se, Te, N, or a combination thereof, for example a fused polycyclic heteroaromatic compound including at least one S, Se, Te, or a combination thereof. For example, the organic semiconductor material may be a fused polycyclic aromatic compound and/or a fused polycyclic heteroaromatic compound having a compact planar structure wherein three or more rings are fused with each other, for example a fused polycyclic aromatic compound and/or a fused polycyclic heteroaromatic compound wherein 4, 5, 6, 7, 8, 9, 10, 11, or 12 rings are condensed.

For example, the organic semiconductor material may be represented by Chemical Formula 1A or 1B.

[Chemical Formula 1A]

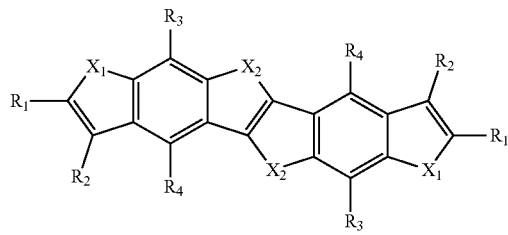

[Chemical Formula 1B]

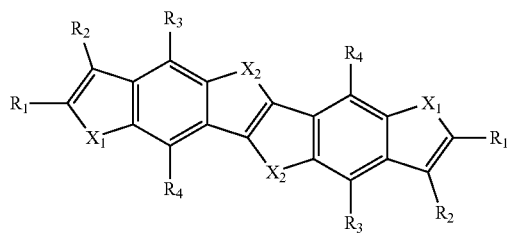

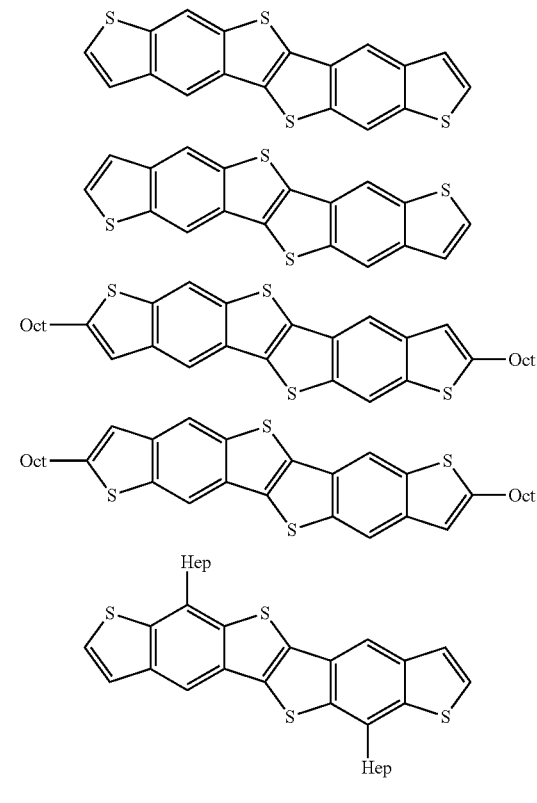

In Chemical Formulae 1A and 1B, $X^1$ and $X^2$ may independently be one of O, S, Se, Te, or N—$R^a$, wherein $R^a$ is one of hydrogen, a substituted or unsubstituted C1 to C12 alkyl group, a substituted or unsubstituted C6 to C30 arylalkyl group, a substituted or unsubstituted C6 to C30 aryl group, a substituted or unsubstituted C1 to C12 alkoxy group, a substituted or unsubstituted C1 to C30 acyl group, a sulfonyl group, or a carbamate group, and $R^1$ to $R^4$ may independently be one of hydrogen, a substituted or unsubstituted C1 to C30 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C6 to C30 arylalkyl group, a substituted or unsubstituted C2 to C30 heteroarylalkyl group, a substituted or unsubstituted C5 to C20 cycloalkyl group, a substituted or unsubstituted C2 to C30 heterocycloalkyl group, a substituted or unsubstituted C6 to C30 aryl group, or a substituted or unsubstituted C2 to C30 heteroaryl group.

The organic semiconductor material represented by Chemical Formula 1A may be for example represented by Chemical Formula 1A-1 and the organic semiconductor material represented by Chemical Formula 1B may be for example represented by Chemical Formula 1B-1.

[Chemical Formula 1A-1]

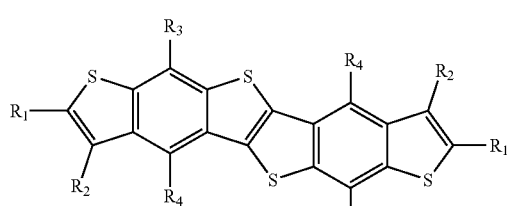

[Chemical Formula 1B-1]

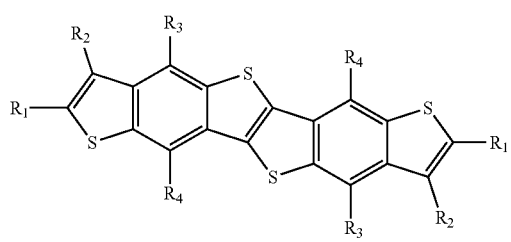

In Chemical Formulae 1A-1 and 1B-1, $R^1$ to $R^4$ are the same as described above.

The organic semiconductor material represented by Chemical Formula 1A or 1B may be for example any one of the following compounds, but is not limited thereto.

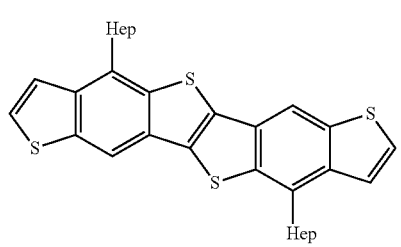

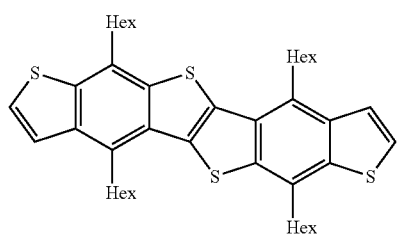

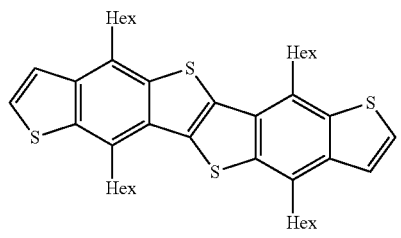

In the compounds, Hex, Hep, and Oct are independently a hexyl group, a heptyl group, and an octyl group.

For example, the organic semiconductor material may be represented by Chemical Formula 2A or 2B.

[Chemical Formula 2A]

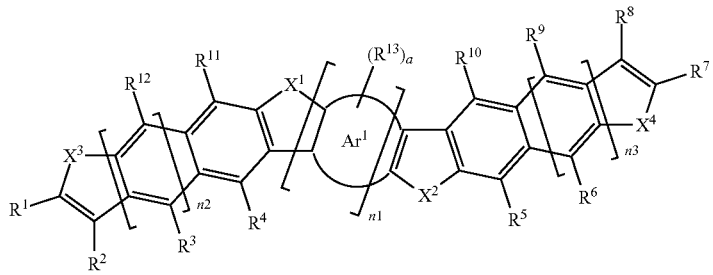

[Chemical Formula 2B]

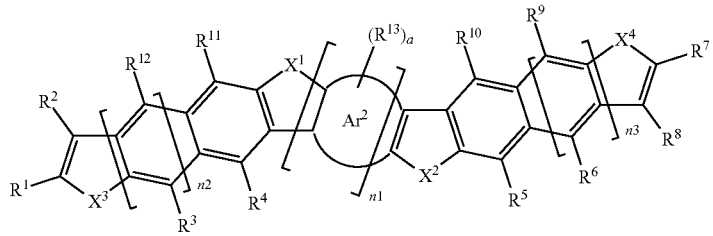

In Chemical Formulae 2A and 2B, $Ar^1$ and $Ar^2$ are independently one of phenylene, naphthalene, or anthracene, a corresponds to the number of hydrogen bonded with carbon of $Ar^1$ and $Ar^2$, $X^1$ to $X^4$ may independently be one of O, S, Se, Te, or N—$R^a$, wherein $R^a$ is independently one of hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C7 to C30 arylalkyl group, a substituted or unsubstituted C6 to C30 aryl group, a substituted or unsubstituted C1 to C30 alkoxy group, a substituted or unsubstituted C6 to C30 aryloxy group (—$OR^b$, wherein $R^b$ is a substituted or unsubstituted C6 to C30 aryl group), a substituted or unsubstituted C4 to C30 cycloalkyl group, a substituted or unsubstituted C4 to C30 cycloalkyloxy group (—$OR^c$, wherein $R^c$ is a substituted or unsubstituted C4 to C30 cycloalkyl group), a substituted or unsubstituted C2 to C30 heteroaryl group, an acyl group (—C(=O)$R^d$, wherein $R^d$ is a substituted or unsubstituted C1 to C30 alkyl group), a sulfonyl group (—S(=O)$_2R^e$, wherein $R^e$ is a substituted or unsubstituted C1 to C30 alkyl group) or a carbamate group (—NHC(=O)$OR^f$, wherein $R^f$ is a substituted or unsubstituted C1 to C30 alkyl group), $R^1$ to $R^{13}$ may independently be one of hydrogen, a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group or a substituted or unsubstituted C2 to C30 heterocycloalkyl group, n1 may be 0 or 1, n2 and n3 may independently be one of 0, 1, 2, or 3, when n1 is 0, n2 and n3 may be one of 1, 2, or 3, and when n1 is 1, n1+n2+n3≥2.

For example, $R^1$ and $R^7$ may be substituted, and may be for example one of a substituted or unsubstituted C1 to C30 alkyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

For example, $R^1$ and $R^7$ may be a fluoro-substituted C1 to C30 alkyl group.

For example, $R^a$ may be one of a substituted or unsubstituted C10 to C30 alkyl group, a substituted or unsubstituted C0 to C30 alkoxy group, a substituted or unsubstituted C10 to C30 alkenyl group, or a substituted or unsubstituted C10 to C30 alkynyl group, for another example, a fluoro-substituted C1 to C30 alkyl group, desirably a C1 to C30 perfluoro alkyl group ($C_nF_{2n+1}$, wherein n is an integer of greater than or equal to 1), or a fluoro-substituted C10 to C30 alkyl group, desirably a C10 to C30 perfluoro alkyl group ($C_nF_{2n+1}$, wherein n is an integer of 10 to 30).

In Chemical Formulae 2A and 2B, when n1 is 0, n2 and n3 may be an integer of 1, 2, or 3 and when n1 is 1, n1+n2+n3≥2, for example when n1 is 1, both n2 and n3 may not be 0.

The organic semiconductor material represented by Chemical Formula 2A or 2B may be for example the following compounds, but is not limited thereto.

(1)

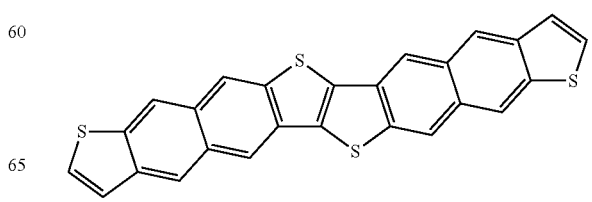

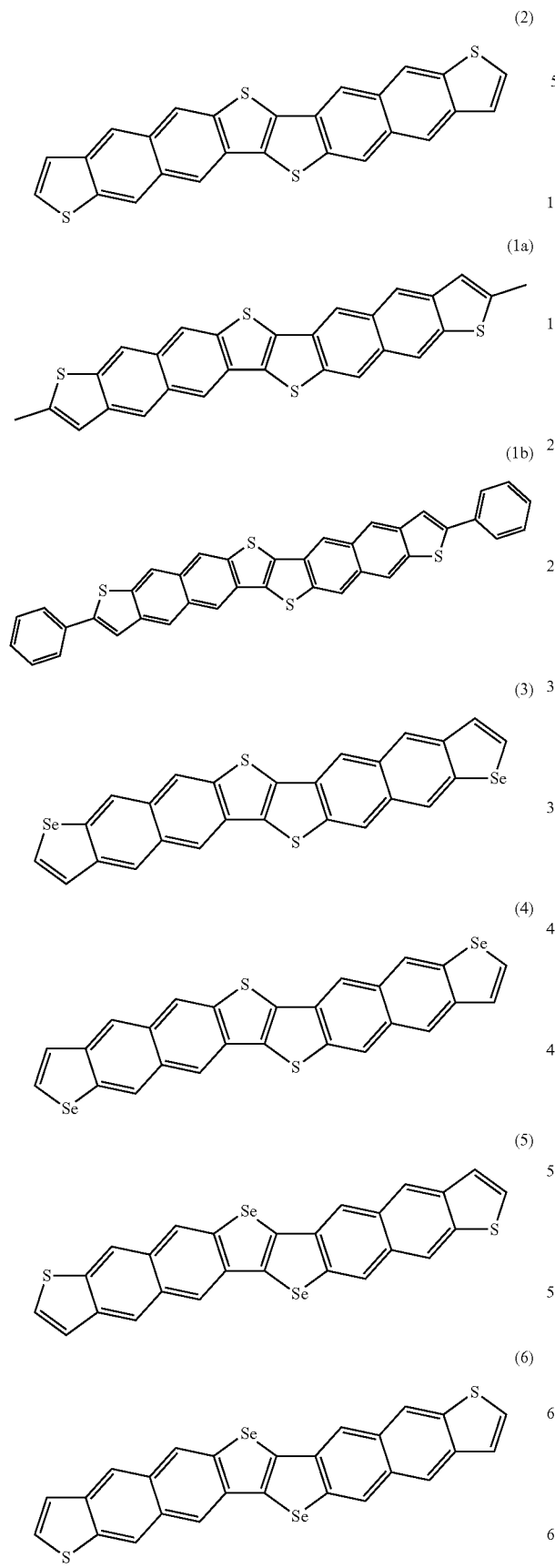
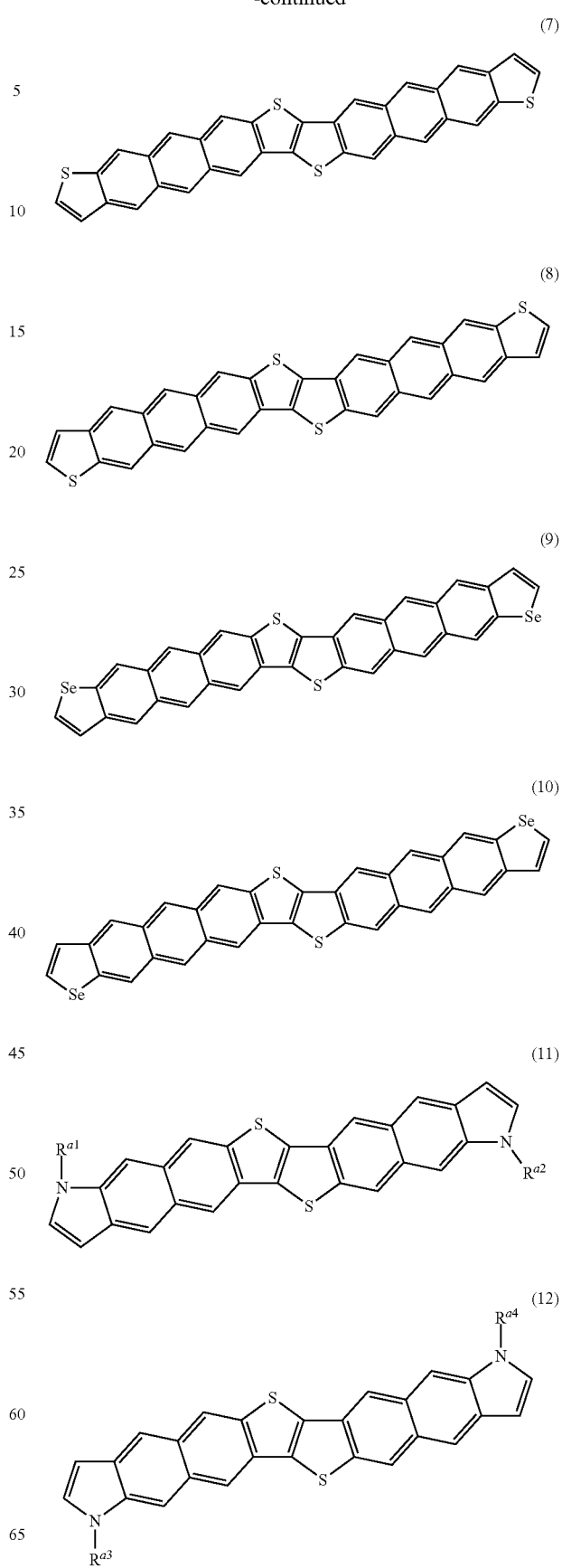

(13)
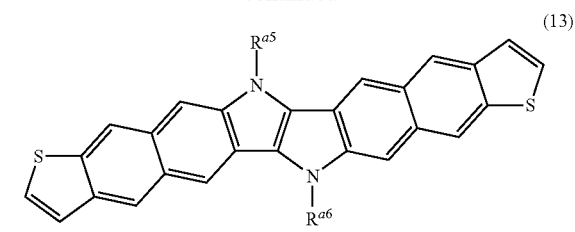
(14)
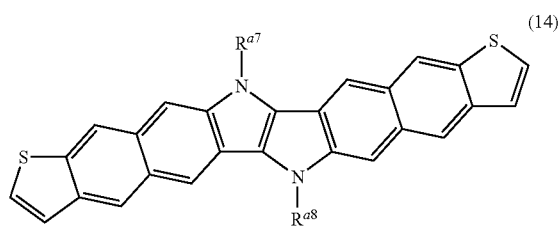
(15)
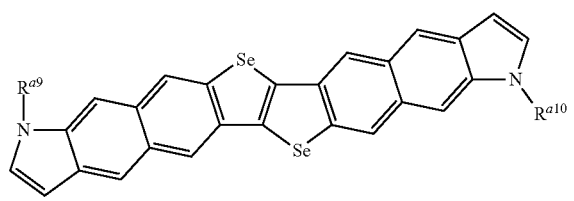
(16)
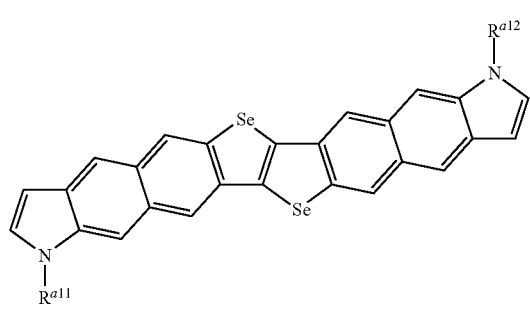
(17)
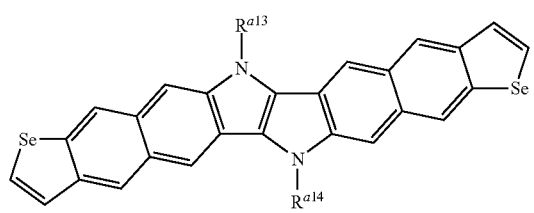
(18)
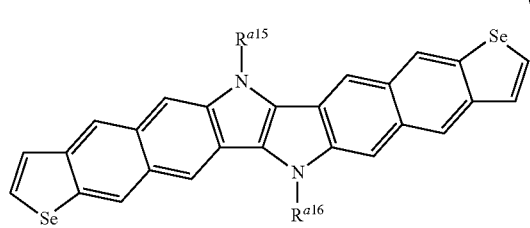
(19)
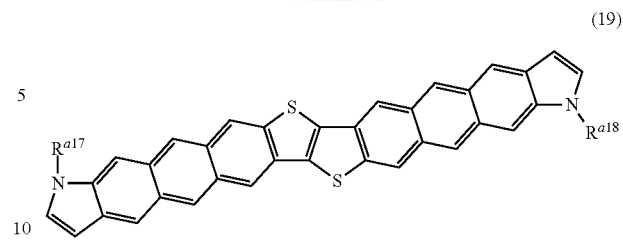
(20)
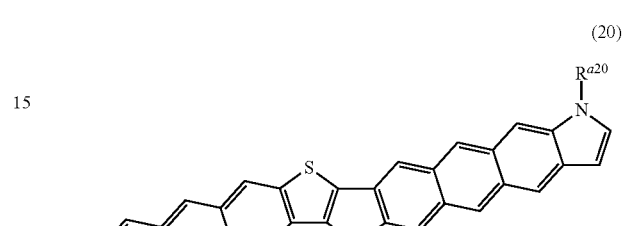
(21)
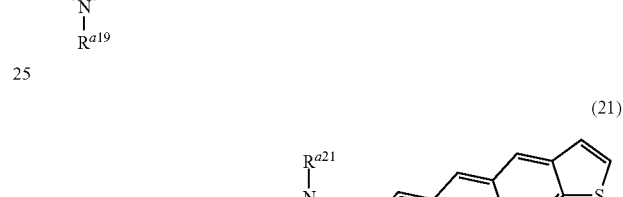
(22)
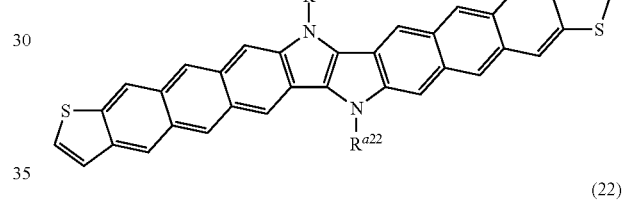
(23)
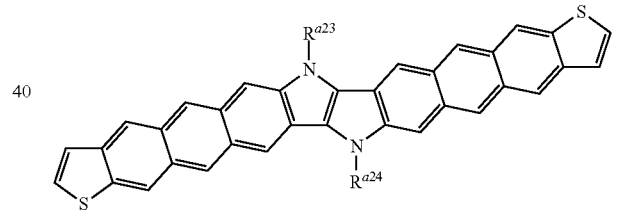
(24)
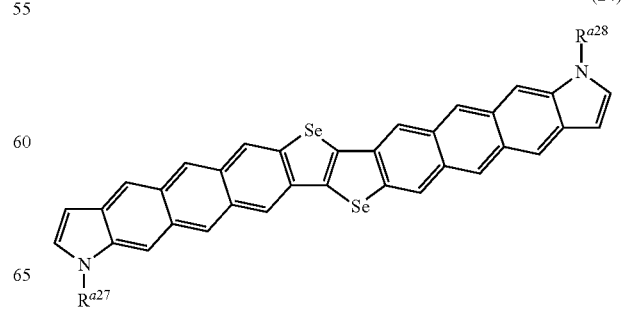

(25)
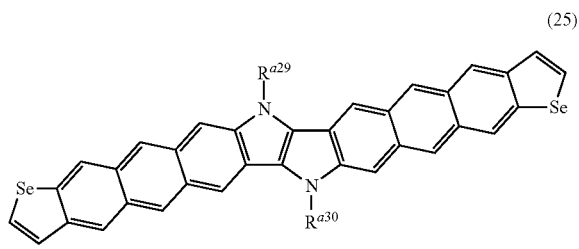
(26)
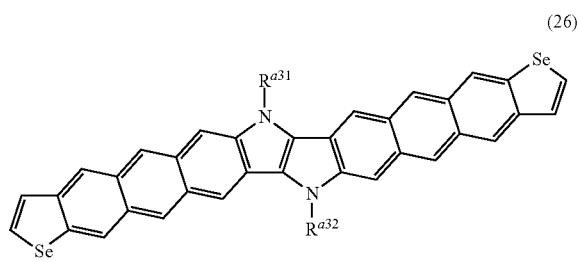
(27)
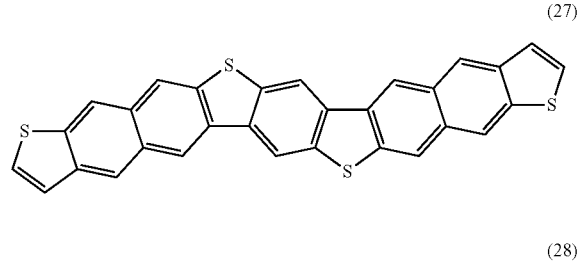
(28)
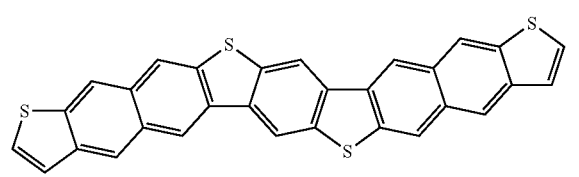
(29)
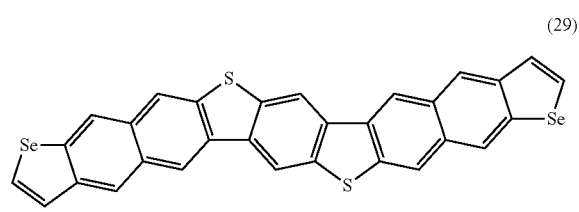
(30)
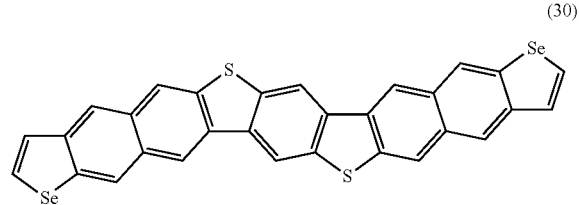
(31)
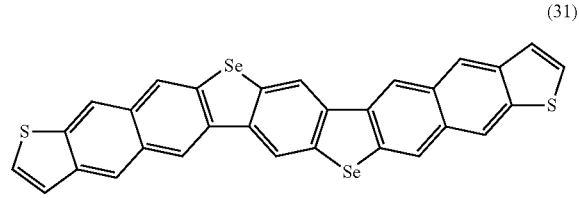
(32)
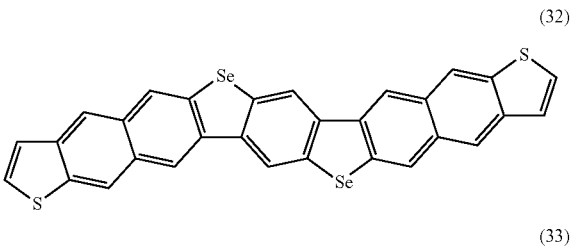
(33)
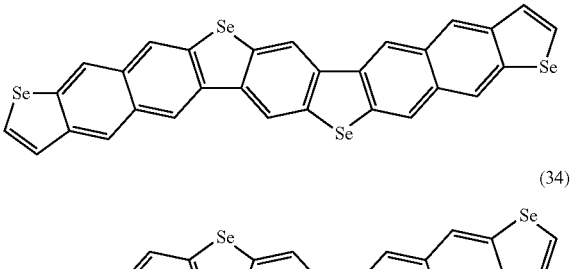
(34)
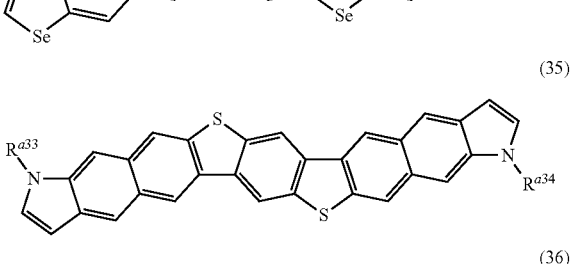
(35)
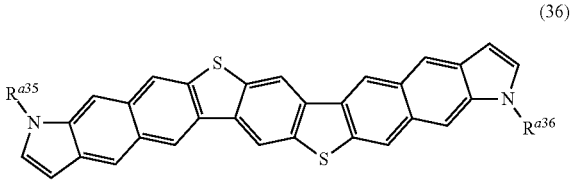
(36)
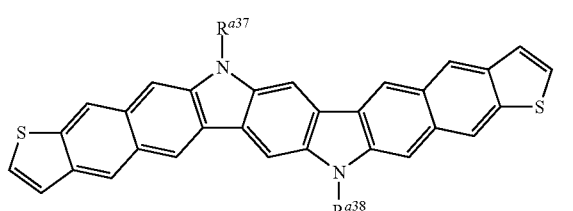
(37)
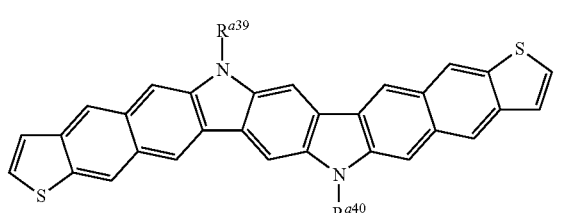
(38)
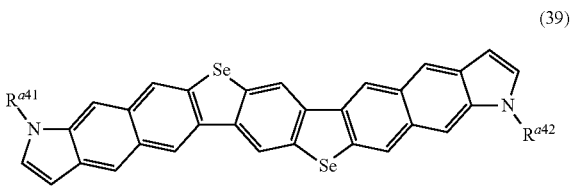
(39)

(40)
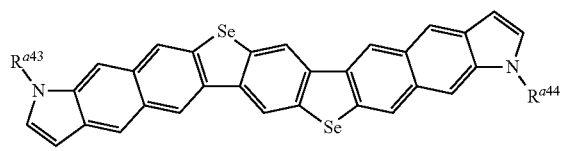
(41)
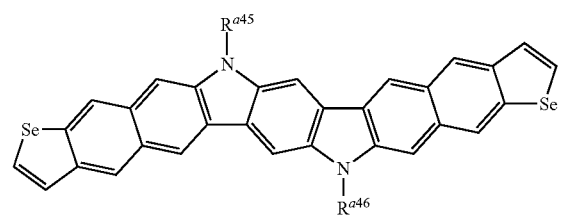
(42)
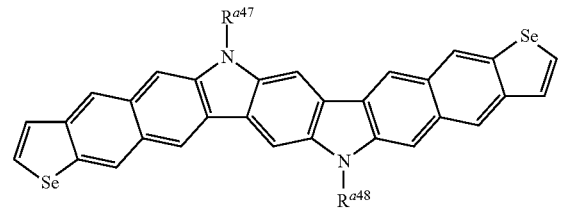
(43)
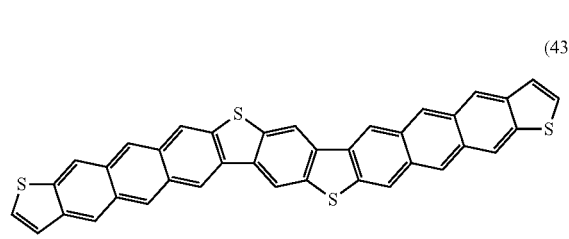
(44)
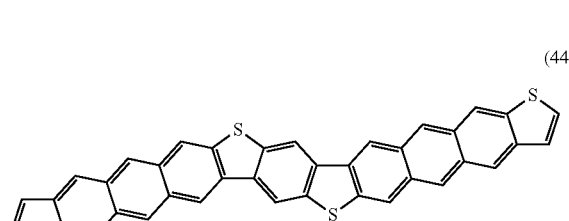
(45)
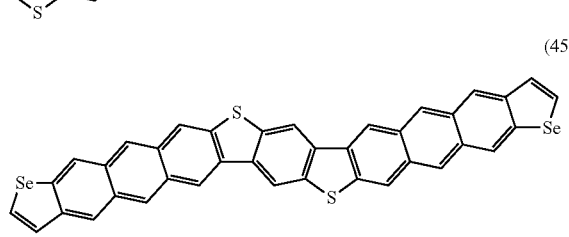
(46)
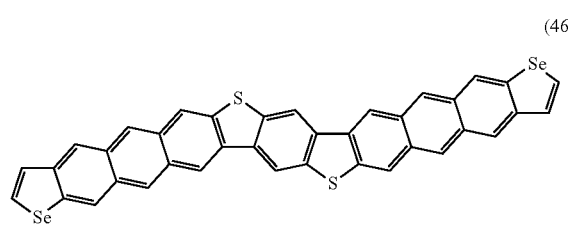
(47)
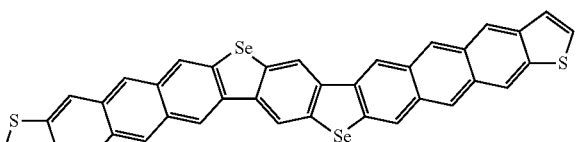
(48)
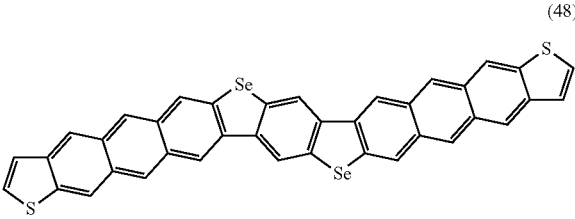
(49)
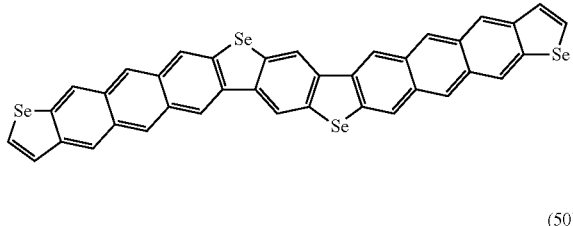
(50)
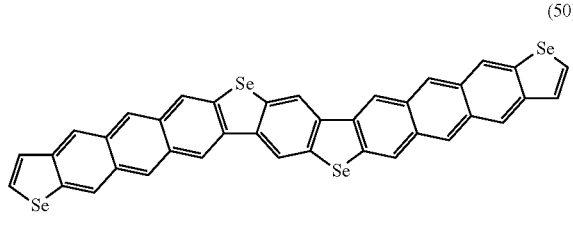
(51)
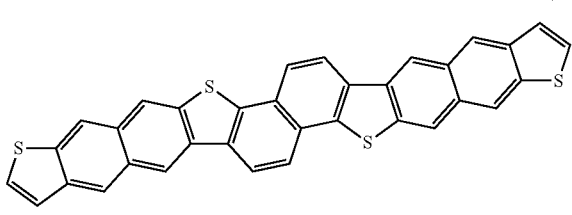
(52)
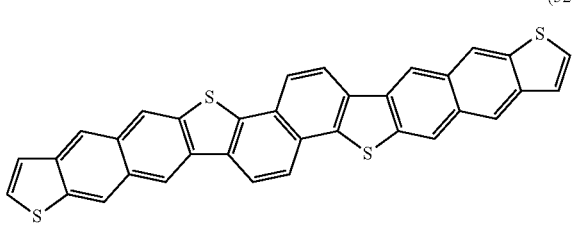
(53)
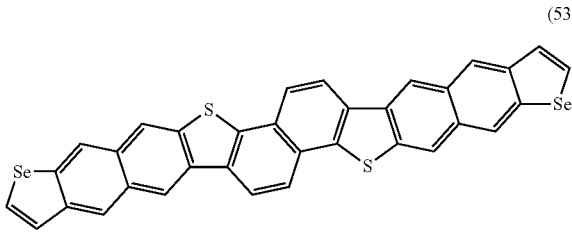

-continued

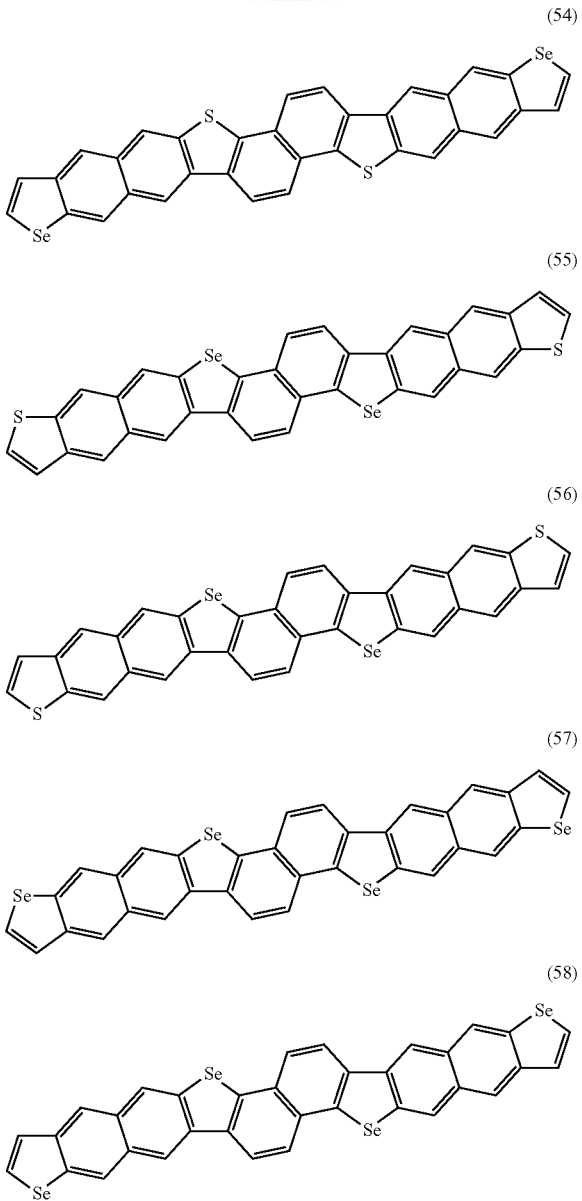

(54)

(55)

(56)

(57)

(58)

In the compounds, hydrogen of each phenylene ring, thiophene ring, a sellenophene ring, and/or a pyrrole ring may be substituted with one of a substituted or unsubstituted C1 to C30 alkyl group, a substituted or unsubstituted C1 to C30 alkoxy group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heteroaryl group, a substituted or unsubstituted C7 to C30 arylalkyl group, a substituted or unsubstituted C2 to C30 heteroarylalkyl group, a substituted or unsubstituted C2 to C30 alkylheteroaryl group, a substituted or unsubstituted C5 to C30 cycloalkyl group, or a substituted or unsubstituted C2 to C30 heterocycloalkyl group.

A surface-modification layer (not shown) may be further formed between the gate insulating layer 141 and the semiconductor layer 154. The surface-modification layer may be for example a layer configured to modify the surface characteristics of the gate insulating layer 141 to be hydrophobic or hydrophilic and may be for example a self-assembled thin film (a self-assembled monolayer, SAM) including octadecyltrichlorosilane, but is not limited thereto.

The source electrode 173 and the drain electrode 175 are formed on the semiconductor layer 154. The source electrode 173 and the drain electrode 175 face each other with the semiconductor layer 154 therebetween and may be electrically connected to the semiconductor layer 154. The source electrode 173 is electrically connected to the data line (not shown) transferring the data signal. The source electrode 173 and the drain electrode 175 may be for example made of gold (Au), copper (Cu), nickel (Ni), aluminum (Al), molybdenum (Mo), chromium (Cr), tantalum (Ta), titanium (Ti), an alloy thereof or a combination thereof.

Hereinafter, a thin film transistor according to another embodiment is described.

Figure 14:
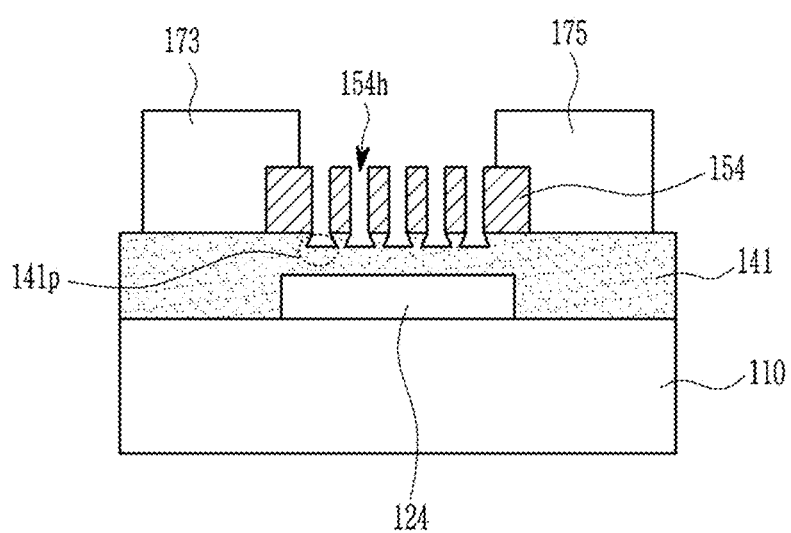
FIG. 14 is a cross-sectional view of a thin film transistor according to another embodiment.

FIG. 14 is a cross-sectional view of a thin film transistor according to another embodiment.

Figure 15:
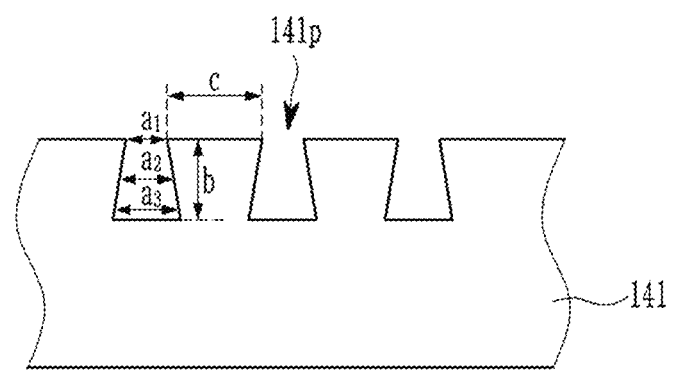
FIG. 15 is a schematic view showing a cross-section of a gate insulating layer 141 in a thin film transistor according to another embodiment.

FIG. 15 is a schematic view showing a cross-section of a gate insulating layer 141 in a thin film transistor according to another embodiment.

The thin film transistor 100 according to the present embodiment includes a gate electrode 124, a gate insulating layer 141, a semiconductor layer 154, a source electrode 173, and a drain electrode 175 like the above embodiment.

However, the thin film transistor 100 according to the present embodiment includes different widths of recess portions 141p of the gate insulating layer 141 depending on a depth, unlike the above embodiment.

Referring to FIG. 15, the recess portions 141p of the gate insulating layer 141 may have a different width depending on a depth, for example, the deeper from the surface of the gate insulating layer 141, the wider. For example, the recess portions 141p of the gate insulating layer 141 may have each first width a1, a second width a2, and a third width a3 at a surface point, a middle point, and a bottom point, and herein, the second width a2 may be wider than the first width a1, and the third width a3 may be wider than the second width a2.

For example, the first width a1, second width a2, and third width a3 of the recess portions 141p may be independently within a sub-micrometer range, for example, respectively in a range of about 5 nm to about 1 μm, respectively in a range of about 10 nm to about 1 μm, respectively in a range of about 20 nm to about 1 μm, respectively in a range of about 30 nm to about 1 μm, respectively in a range of about 40 nm to about 1 μm, respectively in a range of about 50 nm to about 1 μm, respectively in a range of about 50 nm to about 800 nm, respectively in a range of about 50 nm to about 700 nm, respectively in a range of about 50 nm to about 600 nm, or respectively in a range of about 50 nm to about 500 nm.

Hereinafter, a method of manufacturing the thin film transistor according to an embodiment is described.

FIGS. 16 to 21B are cross-sectional views showing a manufacturing method of the thin film transistor of FIG. 1.

Figure 16:
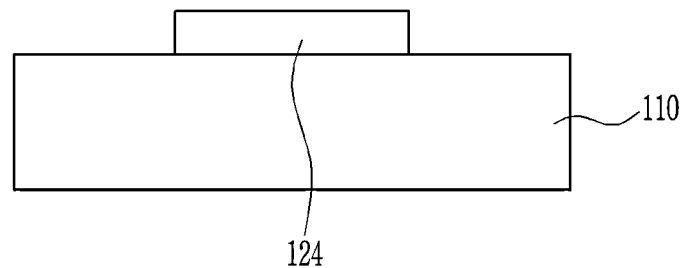
FIGS. 16 to 21B are cross-sectional views sequentially showing a method of manufacturing the thin film transistor of FIG. 1 according to an embodiment.

Referring to FIG. 16, a conductive layer (not shown) for a gate electrode is deposited on a substrate 110 and treated through photolithography to form a gate electrode 124.

Figure 17:
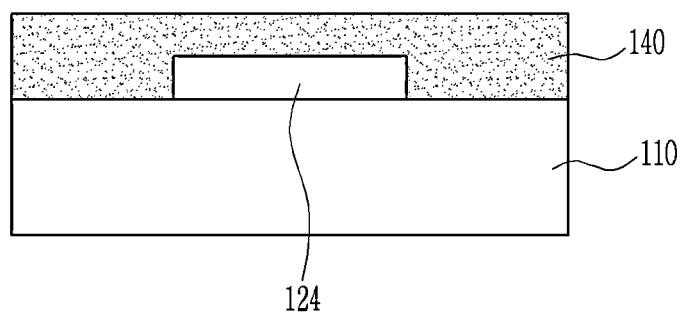

Referring to FIG. 17, a thin film 140 for a gate insulating layer is formed on the whole surface of the substrate 110 including the gate electrode 124. The thin film 140 for the gate insulating layer may be for example formed by depositing or coating silicon oxide ($SiO_2$), silicon nitride (SiNx), aluminum oxide ($Al_2O_3$), or an organic insulator. The depositing may be for example a chemical vapor deposition (CVD), a vacuum deposition, thermal evaporation, a laser deposition, or a solution process. The solution process may be one of a spin coating, a screen printing, a printing, an imprinting, a spin casting, a dipping, a roll coating, a drop casting, a spray coating, a roll printing, a slit coating, or inkjet printing, but are not limited thereto.

Subsequently, recess portions 141p are formed at the surface of the thin film 140 for the gate insulating layer to form a gate insulating layer 141.

For example, the gate insulating layer 141 may be formed by photolithography or a different patterning process. Photolithography may be used to pattern the thin film 140 into the gate insulating layer 141.

Figure 18:
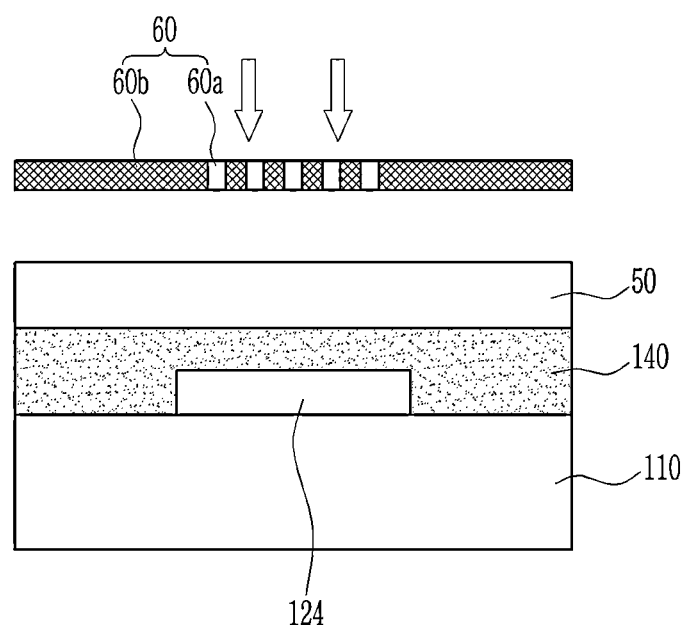

Referring to FIG. 18, a photoresist is coated on the thin film 140 for the gate insulating layer to form a photoresist thin film 50.

Subsequently, a mask 60 is disposed on the photoresist thin film 50 and then, the photoresist film 50 is exposed. The mask 60 has a transmission portion 60a transmitting light and a non-transmission portion 60b not transmitting light. The transmission portion 60a may be disposed to correspond to a place where the recess portions 141p of the gate insulating layer 141 are formed.

Figure 19:
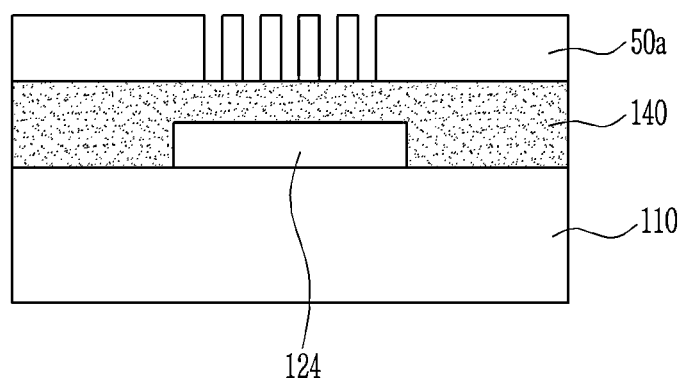

Referring to FIG. 19, the mask 60 is removed and then the photoresist thin film 50 in exposed region is developed and removed to form a photoresist pattern 50a.

Figure 20:
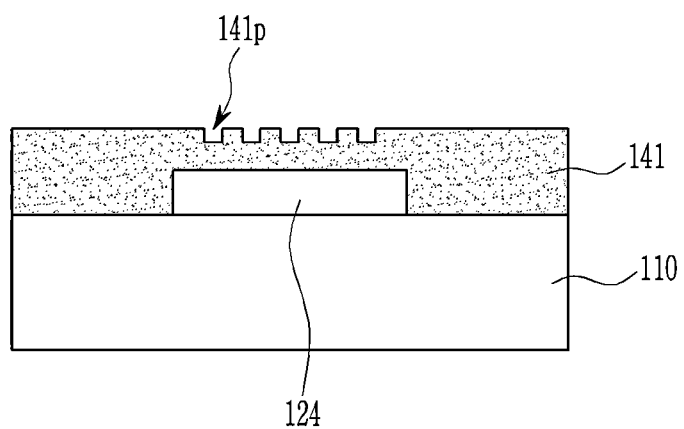

Referring to FIG. 20, the thin film 140 for the gate insulating layer is patterned using the photoresist pattern 50a as a mask to form the gate insulating layer 141 having the plurality of recess portions 141p.

For another example, the gate insulating layer 141 having the plurality of recess portions 141p may be formed by an electron beam (e-beam) lithography.

For another example, the gate insulating layer 141 having the plurality of recess portions 141p may be formed by an imprinting process.

Subsequently, the gate insulating layer 141 optionally may be surface-modified, for example, by arranging a hydrophilic or hydrophobic self-assembled thin film (not shown) to further form a surface-modification layer (not shown) on the surface of the gate insulating layer 141.

Figure 21A:
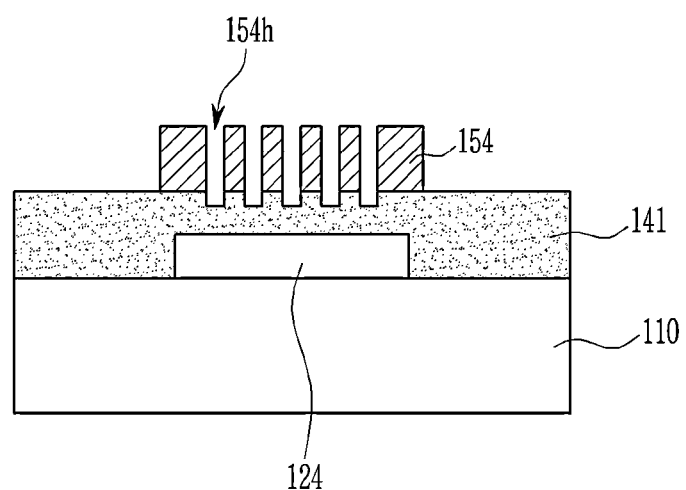

Referring to FIG. 21A, the semiconductor layer 154 is formed on the gate insulating layer 141.

For example, the semiconductor layer 154 may be for example formed by depositing or coating a semiconductor material. The depositing may be for example a chemical vapor deposition (CVD), a vacuum deposition, thermal evaporation, or a laser deposition and the coating may be for example a spin coating, a screen printing, printing, an imprinting, a spin casting, dipping, a roll coating, a drop casting, a spray coating, a roll printing, a slit coating, or an inkjet printing, but are not limited thereto.

Figure 21B:
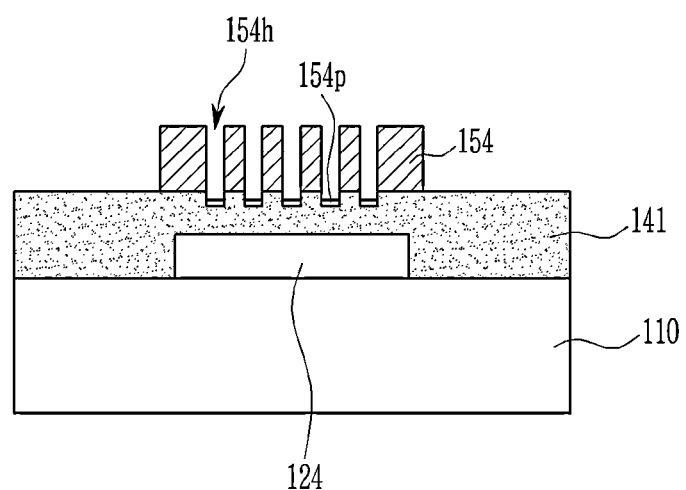

When the semiconductor material is deposited or coated, the semiconductor material is formed exclusively on the surface of the gate insulating layer 141, and thus the semiconductor layer 154 may be formed to have substantially the same morphology as morphology of the surface of the gate insulating layer 141. Accordingly, the semiconductor layer 154 may be formed exclusively on the surface of gate insulating layer 141 except for the recess portions, and accordingly, empty spaces, the holes 154h, may be formed at a place corresponding to the recess portions 141p of the gate insulating layer 141. Otherwise, when the semiconductor material is deposited or coated, a part of the semiconductor material may flow unintentionally into the recess portions 141p, wherein the semiconductor material that flowed into the recess portions 141p (see FIG. 21B illustrating a part of the semiconductor material 154 that flowed into the recess portions 141B) is not connected to the semiconductor material 154 on the surface of the gate insulating layer 141 due to a step between the surface of the gate insulating layer 141 and the bottom surface of the recess portions 141p and thus may have no influence on a function of the semiconductor layer 154.

Referring to FIG. 2, a conductive layer for source and drain electrodes is disposed on the semiconductor layer 154 and photo-etched to form the source electrode 173 and the drain electrode 175. Otherwise, the source electrode 173 and the drain electrode 175 are deposited on the semiconductor layer 154 by using a metal mask.

Although a thin film transistor having a bottom gate structure is discussed as an example, inventive concepts are not limited thereto and may be applied to all thin film transistors.

The thin film transistor 100 may be included in each pixel defined by a gate line 121 and a data line 171, and each pixel may include one or at least two thin film transistors 100.

A thin film transistor array display panel, in which a plurality of thin film transistor 100 may be arranged along a row and/or a column, may include the substrate 110, the gate line 121 and the data line 171 formed on the substrate 110, crossing each other, and defining a plurality of pixels, and the above thin film transistor 100 connected to the gate line 121 and the data line 171 and disposed in each pixel.

The thin film transistor 100 may be applied to a switching or driving device of various electronic devices, and the electronic device may be, for example, a liquid crystal display (LCD), an organic light emitting diode (OLED) display, an electrophoretic display device, an organic sensor, or a wearable device.

Figure 12:
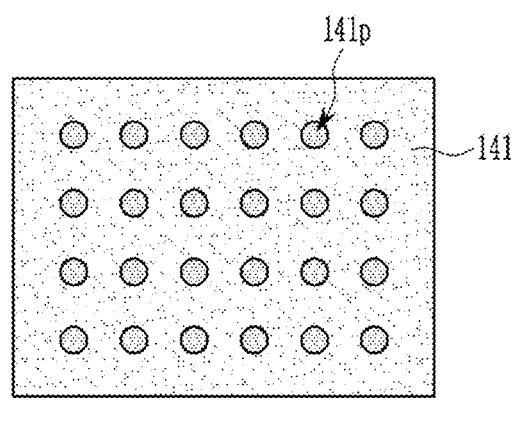
FIG. 12 is a schematic view showing an arrangements of recess portions of the gate insulating layer in an electronic device according to an embodiment.
Figure 12:
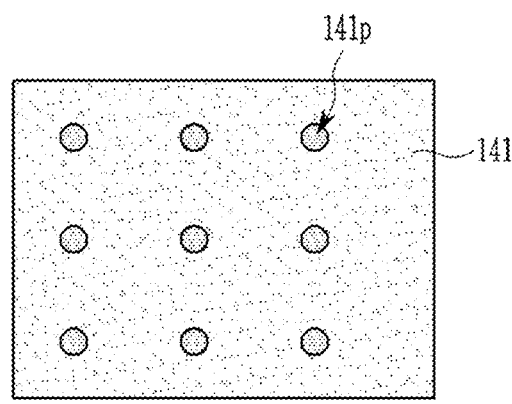
Figure 13:
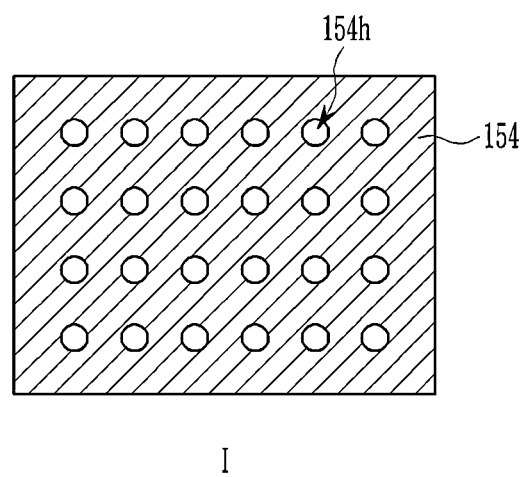
FIG. 13 is a schematic view showing an arrangement of holes of the semiconductor layer in an electronic device according to an embodiment.
Figure 13:
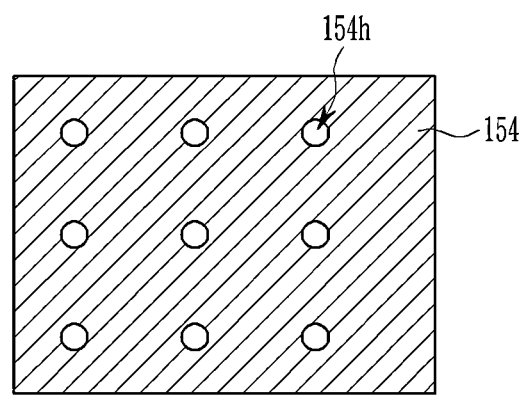

FIG. 12 is a schematic view showing arrangements of recess portions of the gate insulating layer in an electronic device according to an embodiment, and FIG. 13 is a schematic view showing arrangements of holes of the semiconductor layer in an electronic device according to an embodiment.

Referring to FIGS. 12 and 13, an electronic device may include a first region I and a second region II. The density of recess portions 141p of the gate insulating layer 141 and holes 154h of the semiconductor layer 154 may be different in the first region I and the second region II of the substrate in order to form thin film transistors having different charge mobility.

Hereinafter, the embodiments are illustrated in more detail with reference to examples. However, these examples are non-limiting, and inventive concepts are not limited thereto.

Manufacture of Thin Film Transistor

Example 1

A 200 nm-thick gate insulating layer is formed on a silicon wafer substrate by thermally evaporating $SiO_2$. Subsequently, a plurality of recess portions is formed at the surface of the gate insulating layer by using electron beam lithography (JBX-9500, JEOL Inc.). The plurality of recess portions is arranged as a lattice structure, and herein, each recess portion has a width of about 100 nm, a depth of about 50 nm, and an interval of about 400 nm among the neighboring recess portions. Subsequently, the surface of the gate insulating layer is modified by dipping the substrate in a solution prepared for a self-assembled thin film prepared by diluting octadecyltrichlorosilane (ODTS) in a concentration of 5 mM in hexane and then, allowing the substrate to stand for one hour. Then, a 500 Å-thick semiconductor layer is formed by vacuum-depositing an organic semiconductor represented by Chemical Formula A on the gate insulating layer. On the semiconductor layer, a 1000 Å-thick source electrode and a 1000 Å-thick drain electrode is formed by depositing gold (Au) using a metal mask to manufacture a thin film transistor. The thin film transistor has a channel width of about 295 μm and a channel length of about 45 μm.

[Chemical Formula A]

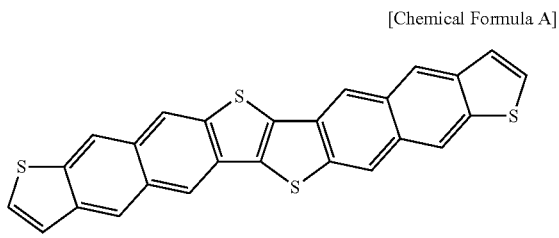 [SMILES: c1cc2cc3cc4c(cc3cc2s1)sc1c2cc3cc5ccsc5cc3cc2sc41]

Example 2

A thin film transistor is manufactured according to the same method as Example 1 except for changing the interval among the neighboring recess portions of the gate insulating layer into about 200 nm. The thin film transistor has a channel width of about 300 μm and a channel length of about 45 μm.

Comparative Example 1

A thin film transistor is manufactured according to the same method as Example 1 except for not forming the recess portions at the surface of the gate insulating layer. The thin film transistor has a channel width of about 295 μm and a channel length of about 40 μm.

Evaluation I

The surfaces of the gate insulating layer and the semiconductor layer in the thin film transistors according to Examples 1 and 2 are examined.

The surfaces of the gate insulating layer and the semiconductor layer are examined by using Atomic Force Microscopy (Dimension Icon, Bruker).

Figure 22:
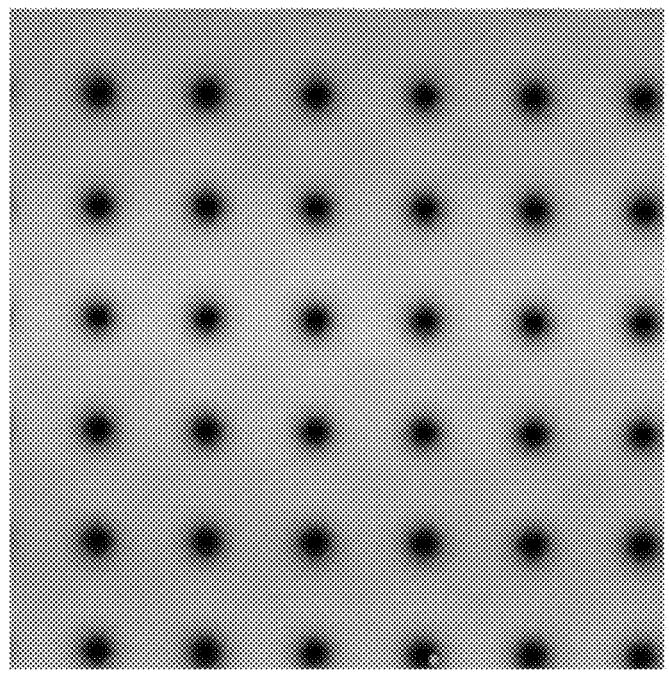
FIG. 22 shows an AFM analysis image of the gate insulating layer in the thin film transistor according to Example 1.
Figure 23:
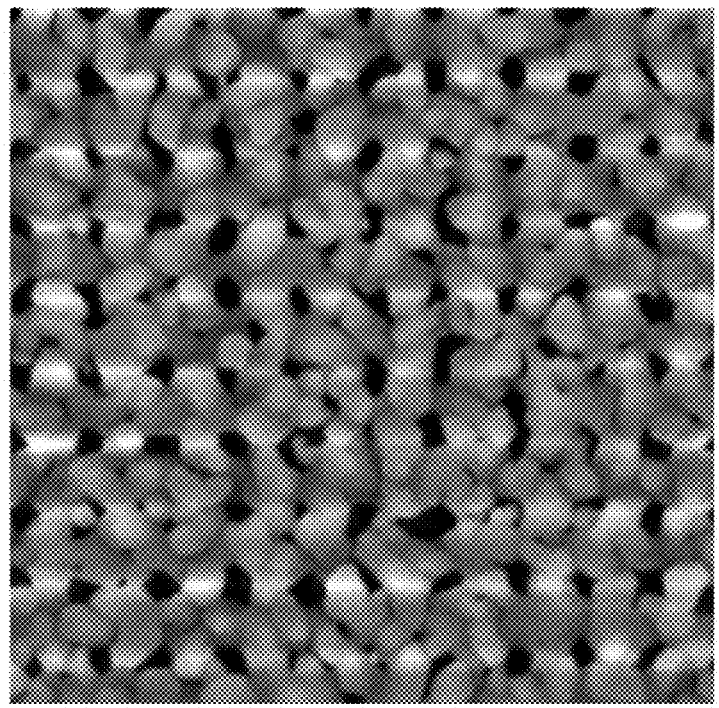
FIG. 23 shows an AFM analysis image of the semiconductor layer in the thin film transistor according to Example 1.
Figure 24:
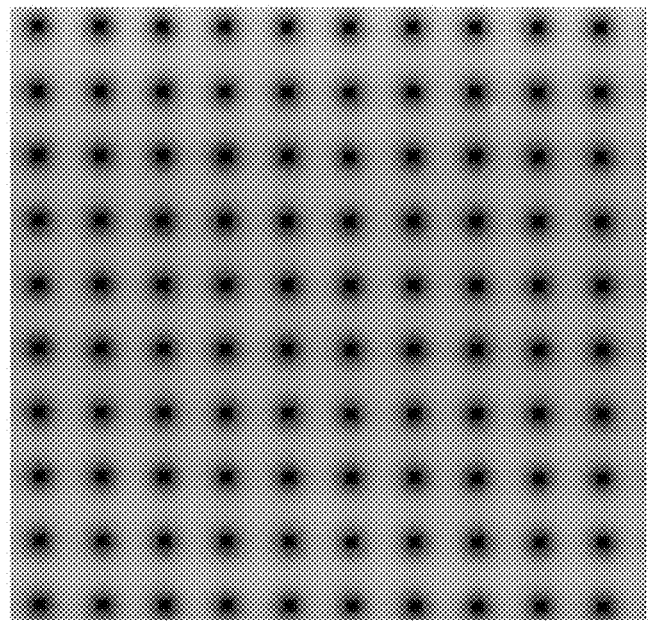
FIG. 24 shows an AFM analysis image of the gate insulating layer in the thin film transistor according to Example 2.
Figure 25:
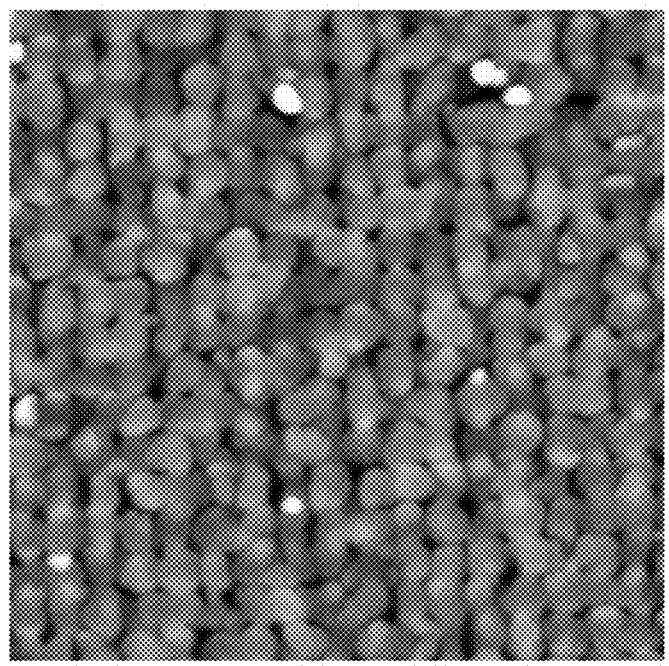
FIG. 25 shows an AFM analysis image of the semiconductor layer in the thin film transistor according to Example 2.

FIG. 22 shows an atomic force microscope (AFM) analysis image of the gate insulating layer in the thin film transistor according to Example 1, FIG. 23 shows an AFM analysis image of the semiconductor layer in the thin film transistor according to Example 1, FIG. 24 shows an AFM analysis image of the gate insulating layer in the thin film transistor according to Example 2, and FIG. 25 shows an AFM analysis image of the semiconductor layer in the thin film transistor according to Example 2.

Referring to FIGS. 22 and 23, the recess portions of the gate insulating layer in the thin film transistor according to Example 1 are formed as a lattice structure, and in addition, holes of the semiconductor layer are formed.

Referring to FIGS. 24 and 25, the recess portions of the gate insulating layer in the thin film transistor according to Example 2 are formed as a more compact lattice structure than the recess portions of the gate insulating layer in the thin film transistor according to Example 1, and in addition, holes of the semiconductor layer are formed to be much closer.

Evaluation II

Charge mobility of the thin film transistors according to Examples 1 and 2 and Comparative Example 1 are evaluated.

The charge mobility is obtained from a slope of a graph having variables of $(I_{SD})^{1/2}$ and $V_G$, which is obtained from a saturation region current formula.

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the equations, $I_{SD}$ is a source-drain current, $\mu$ or $\mu_{FET}$ is the charge mobility, $C_0$ is capacitance of a gate insulating layer, W is a channel width, L is a channel length, $V_G$ is a gate voltage, and $V_T$ is a threshold voltage.

The results are shown in Table 1.

TABLE 1

| | Charge mobility (cm²/Vs) |
|---|---|
| Example 1 | 5.5 |
| Example 2 | 4.0 |
| Comparative Example 1 | 3.3 |

Referring to Table 1, the thin film transistors according to Examples 1 and 2 show higher charge mobility than the thin film transistor according to Comparative Example 1.

While this disclosure has been described in connection with what is presently considered to be practical example embodiments, it is to be understood that inventive concepts are not limited to the disclosed embodiments, but, on the contrary, are intended to cover various modifications and equivalent arrangements included within the spirit and scope of the appended claims.

What is claimed is:
1. A method of manufacturing a thin film transistor, comprising
   forming a gate electrode,
   forming a gate insulating layer, the gate insulating layer having a plurality of recess portions at a surface of the gate insulating layer,
   forming a semiconductor layer connected to the surface of the gate insulating layer such that the gate insulating layer extends between the semiconductor layer and the gate electrode, the semiconductor layer having holes,
   forming a source electrode and a drain electrode connected to the semiconductor layer, and
   wherein each of the holes in the semiconductor layer extends through an entire thickness of the semiconductor layer to expose a lower surface of a corresponding one of the plurality of recess portions at the surface of the gate insulating layer.
2. The method of claim 1, wherein
   the forming the gate insulating layer includes forming the plurality of recess portions at the surface of the gate insulating layer using at least one of a photolithography process or an electron beam lithography process.

3. The method of claim 1, wherein the holes of the semiconductor layer correspond to the plurality of recess portions of the gate insulating layer.

4. The method of claim 3, wherein
the forming the semiconductor layer includes depositing or coating a semiconductor material on the surface of the gate insulating layer having the recess portions, and
the semiconductor material is selectively deposited or coated on the surface of the gate insulating layer except for the recess portions.

5. The method of claim 4, wherein
a part of the semiconductor material flows into the plurality of recess portions, and
the part of the semiconductor material that flows into the plurality of recess portions is not connected to the semiconductor material on the surface of the gate insulating layer.

6. The method of claim 1, further comprising:
modifying the surface of the gate insulating layer before the forming the semiconductor layer.

7. A method of manufacturing a thin film transistor, comprising
forming a gate electrode,
forming a gate insulating layer, the gate insulating layer having a plurality of recess portions at a surface of the gate insulating layer,
forming a semiconductor layer connected to the surface of the gate insulating layer such that the gate insulating layer extends between the semiconductor layer and the gate electrode, the semiconductor layer having holes corresponding to the plurality of recess portions of the gate insulating layer, and
forming a source electrode and a drain electrode connected to the semiconductor layer,
wherein the forming the semiconductor layer includes depositing or coating a semiconductor material on the surface of the gate insulating layer having the recess portions, and
the semiconductor material is selectively deposited or coated on the surface of the gate insulating layer except for the recess portions.

8. The method of claim 7, wherein
a part of the semiconductor material flows into the plurality of recess portions, and
the part of the semiconductor material that flows into the plurality of recess portions is not connected to the semiconductor material on the surface of the gate insulating layer.

9. The method of claim 7, wherein
the forming the gate insulating layer includes forming the plurality of recess portions at the surface of the gate insulating layer using at least one of a photolithography process or an electron beam lithography process.

10. The method of claim 7, further comprising:
modifying the surface of the gate insulating layer before the forming the semiconductor layer.

11. A method of manufacturing a thin film transistor, comprising
forming a gate electrode,
forming a gate insulating layer, the gate insulating layer having a plurality of recess portions at a surface of the gate insulating layer, the gate insulating layer including a first region and a second region, the plurality of recess portions being in the first region,
forming a semiconductor layer connected to the surface of the gate insulating layer such that the gate insulating layer extends between the semiconductor layer and the gate electrode, the semiconductor layer having a plurality of holes, the semiconductor layer being formed on the first region of the gate insulating layer such that the first region is overlapped with the semiconductor layer and the second region is not overlapped with the semiconductor layer, and
forming a source electrode and a drain electrode connected to the semiconductor layer,
wherein the plurality of holes in semiconductor layer are in a portion of the semiconductor layer between the source electrode and the drain electrode in a plan view, and
wherein each of the plurality of holes in the semiconductor layer extends through an entire thickness of the semiconductor layer to expose a lower surface of a corresponding one of the plurality of recess portions in the gate insulating layer.

12. The method of claim 11, wherein
the forming the gate insulating layer includes forming the plurality of recess portions at the surface of the gate insulating layer using at least one of a photolithography process or an electron beam lithography process.

13. The method of claim 11, wherein the holes of the semiconductor layer correspond to the plurality of recess portions of the gate insulating layer.

14. The method of claim 11, wherein
the forming the semiconductor layer includes depositing or coating a semiconductor material on the surface of the gate insulating layer having the recess portions, and
the semiconductor material is selectively deposited or coated on the surface of the gate insulating layer except for the recess portions.

15. The method of claim 14, wherein
a part of the semiconductor material flows into the plurality of recess portions, and
the part of the semiconductor material that flows into the plurality of recess portions is not connected to the semiconductor material on the surface of the gate insulating layer.

16. The method of claim 11, further comprising:
modifying the surface of the gate insulating layer before the forming the semiconductor layer.

* * * * *